US010050583B2

(12) United States Patent
Angel et al.

(10) Patent No.: US 10,050,583 B2
(45) Date of Patent: Aug. 14, 2018

(54) SOLAR GENERATOR WITH LARGE REFLECTOR DISHES AND CONCENTRATOR PHOTOVOLTAIC CELLS IN FLAT ARRAYS

(71) Applicant: ARIZONA BOARD OF REGENTS ON BEHALF OF UNIVERSITY OF ARIZONA, Tucson, AZ (US)

(72) Inventors: Roger P Angel, Tucson, AZ (US); Blake M Coughenour, Tucson, AZ (US); Thomas E Stalcup, Jr., Tucson, AZ (US); Brian Love, Tucson, AZ (US)

(73) Assignee: ARIZONA BOARD OF REGENTS ON BEHALF OF UNIVERSITY OF ARIZONA, Tucson, AZ (US)

( * ) Notice: Subject to any disclaimer, the term of this patent is extended or adjusted under 35 U.S.C. 154(b) by 140 days.

(21) Appl. No.: 14/647,589

(22) PCT Filed: Nov. 26, 2013

(86) PCT No.: PCT/US2013/071974
§ 371 (c)(1),
(2) Date: May 27, 2015

(87) PCT Pub. No.: WO2014/085436
PCT Pub. Date: Jun. 5, 2014

(65) Prior Publication Data
US 2015/0303867 A1 Oct. 22, 2015

Related U.S. Application Data

(60) Provisional application No. 61/797,168, filed on Nov. 30, 2012.

(51) Int. Cl.
*H02S 40/22* (2014.01)
*H01L 31/054* (2014.01)
*H02S 20/32* (2014.01)

(52) U.S. Cl.
CPC .......... *H02S 40/22* (2014.12); *H01L 31/0543* (2014.12); *H01L 31/0547* (2014.12); *H02S 20/32* (2014.12); *Y02E 10/52* (2013.01)

(58) Field of Classification Search
CPC ..... H02S 40/22; H02S 20/32; H01L 31/0547; H01L 31/0543
See application file for complete search history.

(56) References Cited

U.S. PATENT DOCUMENTS

| 608,755 A | 8/1898 | Cottle |
| 642,196 A | 1/1900 | Belcher |

(Continued)

FOREIGN PATENT DOCUMENTS

| CN | 2597897 | 1/2004 |
| CN | 2599483 | 1/2004 |

(Continued)

OTHER PUBLICATIONS

International Preliminary Report on Patentability dated May 6, 2016 from International Application PCT/US2014/061584.

(Continued)

*Primary Examiner* — Devina Pillay
(74) *Attorney, Agent, or Firm* — Snell & Wilmer, L.L.P.

(57) ABSTRACT

An apparatus is disclosed for generation of electricity using sunlight focused onto multi junction photovoltaic cells having high conversion efficiency. The apparatus includes a large paraboloidal mirror of back-silvered glass, turned to the sun throughout the day, so as to provide an intense focus. Multiple photovoltaic cells are provided at the focus. The optics are configured to distribute sunlight without signifi- (Continued)

cant loss into separate regions matched to the photovoltaic cell size. A secondary optical system takes strongly focused sunlight near the focus of a single paraboloidal mirror and distributes it equally between the cells, and regions of equally concentrated sunlight are matched to cell size and are substantially co-planar, so that the cells may be grouped on flat circuit cards.

10 Claims, 38 Drawing Sheets

(56) References Cited

U.S. PATENT DOCUMENTS

| | | | |
|---|---|---|---|
| 2,661,672 A | 12/1953 | Fairbanks |
| 2,827,690 A | 3/1958 | Brown |
| 2,904,612 A | 9/1959 | Regnier |
| 3,427,200 A | 2/1969 | Ernest et al. |
| 3,552,941 A | 1/1971 | Giffen |
| 3,586,492 A | 6/1971 | McMaster |
| 3,756,797 A | 9/1973 | Akeyoshi |
| 3,977,773 A | 8/1976 | Hubbard |
| 4,088,470 A | 5/1978 | Bourg et al. |
| 4,105,429 A | 8/1978 | Delgado |
| 4,107,521 A | 8/1978 | Winters |
| 4,154,219 A | 5/1979 | Gupta et al. |
| 4,180,414 A | 12/1979 | Diamond et al. |
| 4,245,895 A | 1/1981 | Wildenrotter |
| 4,313,746 A | 2/1982 | Juras |
| 4,354,193 A | 10/1982 | Werner |
| 4,404,565 A | 9/1983 | Gurney et al. |
| 4,436,373 A | 3/1984 | Kirsch |
| 4,473,065 A | 9/1984 | Bates |
| 4,525,196 A | 6/1985 | Fecik et al. |
| 4,547,650 A | 10/1985 | Arditty |
| 4,616,909 A | 10/1986 | Dane |
| 4,678,292 A | 7/1987 | Miyatani et al. |
| 4,805,006 A | 2/1989 | Yamagushi et al. |
| 4,830,678 A | 5/1989 | Todorof et al. |
| 4,999,059 A | 3/1991 | Bagno |
| 5,118,543 A | 6/1992 | McColl |
| 5,129,934 A | 7/1992 | Koss |
| 5,143,535 A | 9/1992 | Herrington |
| 5,147,437 A | 9/1992 | Bristol |
| 5,169,456 A | 12/1992 | Johnson |
| 5,281,249 A | 1/1994 | Hampton et al. |
| 5,363,116 A | 11/1994 | Allen |
| 5,460,659 A | 10/1995 | Krut |
| 5,593,901 A | 1/1997 | Oswald et al. |
| 5,787,878 A | 8/1998 | Ratliff |
| 6,034,319 A | 3/2000 | Falbel |
| 6,091,017 A | 7/2000 | Stern |
| 6,123,067 A | 9/2000 | Warrick |
| 6,257,022 B1 | 7/2001 | Caplan et al. |
| 6,301,932 B1 | 10/2001 | Allen et al. |
| 6,375,135 B1 | 4/2002 | Eason et al. |
| 6,498,290 B1 | 12/2002 | Lawheed |
| 6,541,694 B2 | 4/2003 | Winston |
| 6,563,040 B2 | 5/2003 | Hayden et al. |
| 6,629,436 B1 | 10/2003 | Skeen |
| 6,739,729 B1 | 5/2004 | Blackmon et al. |
| 6,848,442 B2 | 2/2005 | Haber |
| 6,895,145 B2 | 5/2005 | Ho |
| 7,076,965 B2 | 7/2006 | Lasich |
| 7,258,320 B2 | 8/2007 | Tai |
| 7,297,865 B2 | 11/2007 | Terao et al. |
| 7,380,549 B1 | 6/2008 | Ratliff |
| 7,506,847 B2 | 3/2009 | Bailey |
| 8,082,755 B2 | 12/2011 | Angel |
| 8,350,145 B2 | 1/2013 | Angel |
| 8,430,090 B2 | 4/2013 | Angel |
| 8,505,867 B2 | 8/2013 | Conrad |
| 2001/0036024 A1 | 11/2001 | Wood |
| 2003/0005954 A1 | 1/2003 | Emoto et al. |
| 2004/0107731 A1 | 6/2004 | Doehring et al. |
| 2005/0051205 A1 | 3/2005 | Mook et al. |
| 2005/0166957 A1 | 8/2005 | Imoto et al. |
| 2006/0054162 A1 | 3/2006 | Romeo |
| 2006/0231133 A1 | 10/2006 | Fork |
| 2006/0243319 A1 | 11/2006 | Kusek et al. |
| 2007/0089774 A1 | 4/2007 | Lasich |
| 2007/0089778 A1 | 4/2007 | Horne et al. |
| 2007/0256726 A1 | 11/2007 | Ford et al. |
| 2007/0272666 A1 | 11/2007 | O'Brien |
| 2008/0000516 A1 | 1/2008 | Shifman |
| 2008/0047605 A1 | 2/2008 | Benitez et al. |
| 2008/0053513 A1 | 3/2008 | Palmer |
| 2008/0092877 A1 | 4/2008 | Monsebroten |
| 2009/0056790 A1 | 3/2009 | Tian |
| 2009/0277224 A1 | 11/2009 | Angel et al. |
| 2009/0277498 A1* | 11/2009 | Angel ............... C03B 23/0256 136/246 |
| 2010/0139645 A1 | 6/2010 | Whipple |
| 2012/0174966 A1 | 7/2012 | Snipes |
| 2012/0229911 A1 | 9/2012 | Rodriguez-Parada et al. |
| 2012/0260908 A1 | 10/2012 | Orsello |
| 2012/0312349 A1* | 12/2012 | Farberov ............ H01L 31/0543 136/246 |
| 2012/0316017 A1 | 12/2012 | Chiel |
| 2013/0206935 A1 | 8/2013 | Majid et al. |
| 2014/0053607 A1 | 2/2014 | Angel |
| 2014/0116419 A1 | 5/2014 | Hernandez et al. |
| 2014/0238387 A1 | 8/2014 | Kroyzer et al. |
| 2014/0251308 A1 | 9/2014 | Wyle et al. |
| 2014/0261387 A1 | 9/2014 | Hansen |
| 2015/0316639 A1 | 11/2015 | Russ |
| 2016/0079461 A1 | 3/2016 | Angel |
| 2016/0238189 A1 | 8/2016 | Angel |

FOREIGN PATENT DOCUMENTS

| | | |
|---|---|---|
| DE | 3104690 | 8/1982 |
| DE | 202007016715 | 3/2008 |
| EP | 1903155 | 3/2008 |
| EP | 1956662 | 8/2008 |
| EP | 1956662 | 12/2009 |
| FR | 2434343 | 4/1980 |
| GB | 770097 | 3/1957 |
| GB | 1529409 | 10/1978 |
| JP | 491610 | 1/1974 |
| JP | 58194751 | 11/1983 |
| JP | 6060934 | 4/1985 |
| JP | 2003069069 | 6/1986 |
| JP | 63021229 | 1/1988 |
| JP | 8194103 | 7/1996 |
| JP | 61119081 | 3/2000 |
| JP | 2000091612 | 3/2000 |
| JP | 2000243983 | 9/2000 |
| JP | 2003258291 | 9/2003 |
| TW | 332104 | 11/2007 |
| WO | WO2005042420 | 5/2005 |
| WO | WO2008013976 | 1/2008 |
| WO | WO2008043871 | 4/2008 |
| WO | WO2009008996 | 1/2009 |
| WO | WO 2009121174 | 10/2009 |
| WO | WO 2010051599 | 5/2010 |
| WO | WO2010091391 | 8/2010 |
| WO | WO 2012032462 | 3/2012 |
| WO | WO2012097260 | 7/2012 |

OTHER PUBLICATIONS

International Search Report and Written Opinion dated Jan. 27, 2015 from corresponding International Application PCT/US2014/061584.
Nishi et al., USPTO Translation of JP-60-60934, created Dec. 2015, pp. 1-22.
International Search Report and Written Opinion dated Aug. 25, 2009 from International Application PCT/US2009/043381.
International Search Report and Written Opinion from Int'l Application No. PCT/US09/043377 dated May 28, 2010.

(56) References Cited

OTHER PUBLICATIONS

International Preliminary Report on Patentability from Int'l Application No. PCT/US09/043381 dated Aug. 16, 2010.
International Search Report and Written Opinion from Int'l Application No. PCT/US09/043378 dated Jun. 9, 2010.
Reply to EPO Communication Pursuant to Rules 161(1) and 162 EPC from related EPC Application No. 09 747 260.9, based on PCT/US2009/043378.
International Preliminary Report on Patentability from Int'l Application No. PCT/US2009/043377 (corrected version) dated Jan. 20, 2011.
Reply to EPO Communication Pursuant to Rules 161(1) and 162 EPC from corresponding EPC Application No. 09 747 261.7, based on PCT/US2009/043381.
Reply to EPO Communication Pursuant to Rules 161(1) and 162 EPC from related EPC Application No. 09 747 259.1, based on PCT/US2009/043377.
Office Action dated Nov. 23, 2012 in German Application No. 11 2009 001 132.2-33.
Office Action received on Nov. 15, 2012 in Japanese Application No. 2011-509577.
Office Action received on Nov. 30, 2012 in Chinese Application No. 200980116969.2.
Office Action dated Oct. 30, 2012 in Application No. GB1019206.0.
Office Action dated Nov. 16, 2012 in Chinese Application No. 200980116959.9.
Office Action dated Nov. 23, 2012 in German Application No. 11 2009 001 135.7-33.
Office Action received Dec. 4, 2012 in Mexican Application No. Mx/a/2010/012356.
Office Action dated Sep. 13, 2012 in Mexican Application No. MX/a/2010/012355.
Examination Report dated Sep. 25, 2012 in European Application No. 09747261.7.
Office Action dated Aug. 22, 2012 in Japanese Application No. 2011-509579.
Examiner's Report received on Aug. 15, 2012 in Austrailian Application No. 2009246638.
Office Action dated Sep. 25, 2012 in Japanese Application No. 2011-509578.
Examination Report dated Jul. 10, 2012 in European Application No. 09747261.7.
Examination Report dated May 21, 2012 in European Application No. 09747260.9.
Office Action received Jul. 13, 2012 in Mexican Application No. MX/a/2010/12356.
Combined Search and Examination Report dated Jul. 24, 2012 in Great Britain Application No. 1203267.8.
Examination Report dated Jul. 24, 2012 in Great Britain Application No. 1019139.3.
Office Action dated Jul. 3, 2012 in Chinese Application No. 20090116968.8.
Examiner's Report received Feb. 23, 2012 in European Application No. 09747259.1
Examiner's Report received Feb. 26, 2012 in Great Britain Application No. 1019206.0.
AU; Examination Report dated May 9, 2011 in Application No. 2009246637.
GB; Examination Report dated Sep. 16, 2011 in Application No. GB1019160.9.
AU; Examination Report dated Oct. 4, 2011 in Application No. 2009246639.
DE; Office Action dated Jan. 10, 2012 in Application No. 11 2009 001 131.4-45.
AU; Examination Report dated May 10, 2011 in Application No. 2009246638.
KR; Notification of Provisional Rejection dated in Aug. 29, 2011 in Application No. 10-2010-7025551.
PCT; International Preliminary Report on Patentability dated Mar. 29, 2011 in Application No. PCT/US2009/043378.
GB; Examination Report dated Sep. 16, 2011 in Application No. GB1019139.3.
GB; Examination Report dated Jan. 11, 2012 in Application No. GB1019139.3.
USPTO; Restriction Requirement dated Dec. 2, 2016 in U.S. Appl. No. 14/632,637.
USPTO; Non-Final Office Action dated Jun. 17, 2015 in U.S. Appl. No. 14/071,417.
USPTO; Final Office Action dated Jan. 8, 2016 in U.S. Appl. No. 14/071,417.
USPTO; Advisory Action dated Mar. 24, 2016 in U.S. Appl. No. 14/071,417.
USPTO; Non-Final Office Action dated Aug. 17, 2016 in U.S. Appl. No. 14/071,417.
USPTO; Notice of Allowance dated Aug. 24, 2011 in U.S. Appl. No. 12/463,026.
USPTO; Notice of Allowance dated Oct. 4, 2012 in U.S. Appl. No. 12/463,016.
USPTO; Office Action dated Jan. 20, 2012 in U.S. Appl. No. 12/463,016.
USPTO; Office Action Restriction dated Oct. 11, 2011 in U.S. Appl. No. 12/463,016.
USPTO; Restriction Requirement dated Aug. 31, 2012 in U.S. Appl. No. 12/463,001.
USPTO; Non-Final Office Action dated Nov. 21, 2012 in U.S. Appl. No. 12/463,001.
USPTO; Notice of Allowance dated Mar. 5, 2013 in U.S. Appl. No. 12/463,001.
USPTO; Non-Final Office Action dated Feb. 14, 2013 in U.S. Appl. No. 13/302,084.
USPTO; Final Office Action dated May 29, 2013 in U.S. Appl. No. 13/302,084.
USPTO; Notice of Allowance dated Aug. 7, 2013 in U.S. Appl. No. 13/302,084.
PCT; International Search Report and Written Opinion dated Nov. 2, 2016 in Intl Application No. PCT/US16/45355.
Leland, J. E90: Self-Replicating Milling Machine. Blog with photos (online). Swarthmore College, 2012. (Retrieved on Jul. 31, 2013).
Dan Friedman, National Solar Technology Roadmap: Concentrator PV, Management Report NREL/MP-520-41735, Solar Energy Technologies Program, Jun. 2007, pp. 1-3 (draft version), U.S. Department of Energy.
Geoffrey S. Kinsey, et al., Multijunction Solar Cells for Dense-Array Concentrators, pp. 625-627, 2006, 1-4244-0016-3, IEEE.
David Faiman, Large-Area Concentrators, 2nd Workshop on "The path to ultra-high efficient photovoltaics," Oct. 3-4, 2002, pp. 1-8, JRC Ispra, Italy.
Anja Royne, et al., Cooling of Photovoltaic Cells Under Concentrated Illumination: A Critical Review, Solar Energy Materials & Solar Cells, 2005 (available on-line Oct. 28, 2004), pp. 451-483,86, Elsevier BY.
Geoffrey S. Kinsey et al., Concentrator Multijunction Solar Cell Characteristics Under Variable Intensity and Temperature, Progress in Photovoltaics: Research and Applications, May 1, 2008 (online), pp. 503-508,16, John D Wiley & Sons, Ltd.
Sarah Kurtz, Opportunities and Challenges for Development of a Mature Concentrating Photovoltaic Power Industry, Technical Report NRELITP-5200-43208, Jun. 2011 (revised), pp. 1-32, U.S. Department of Energy.
Ugur Ortabasi et al., Dish/Photovoltaic Cavity Converter (PVCC) System for Ultimate Solar-to-Electricity Conversion Efficiency General Concept and First Performance Predictions, pp. 1616-1620, 2002, 0-7803-7471-1, IEEE.
USPTO; Non-Final Office Action dated Dec. 29, 2016 in U.S. Appl. No. 15/030,692.
International Preliminary Report on Patentability dated Jun. 11, 2015 from corresponding International Application PCT/US2013/071974.
International Search Report and Written Opinion dated Apr. 2, 2014 from corresponding International Application PCT/US2013/071974.

* cited by examiner

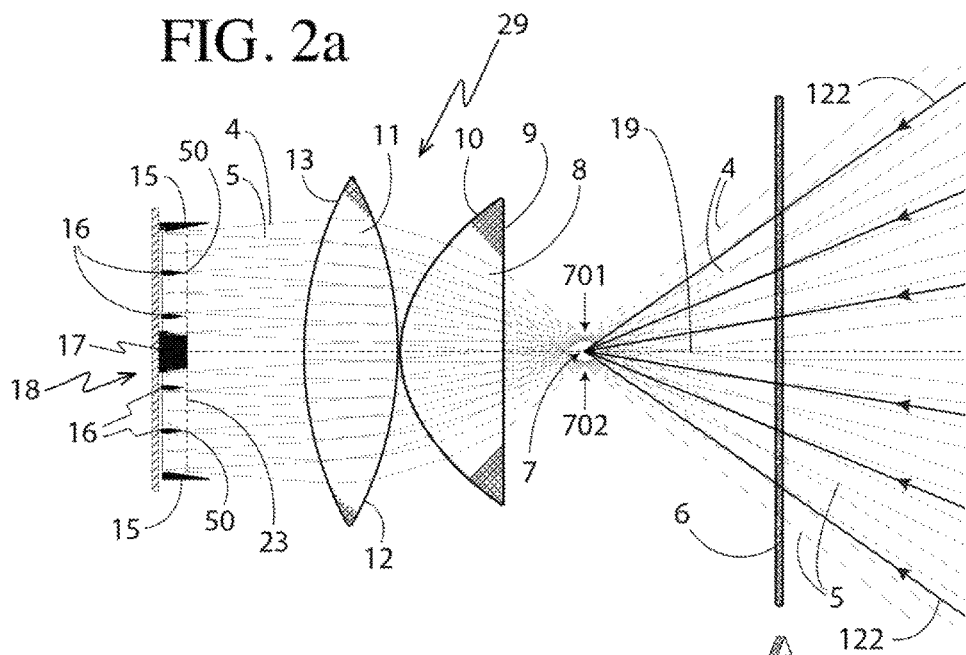
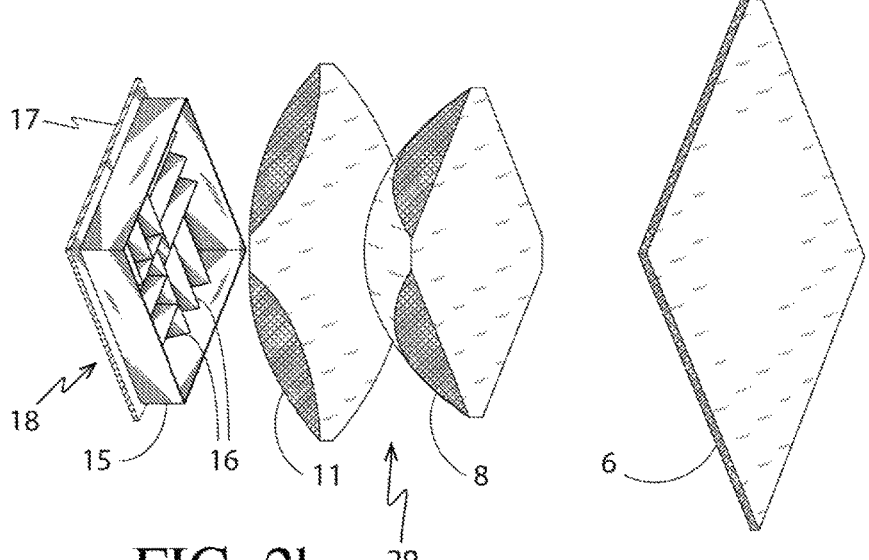

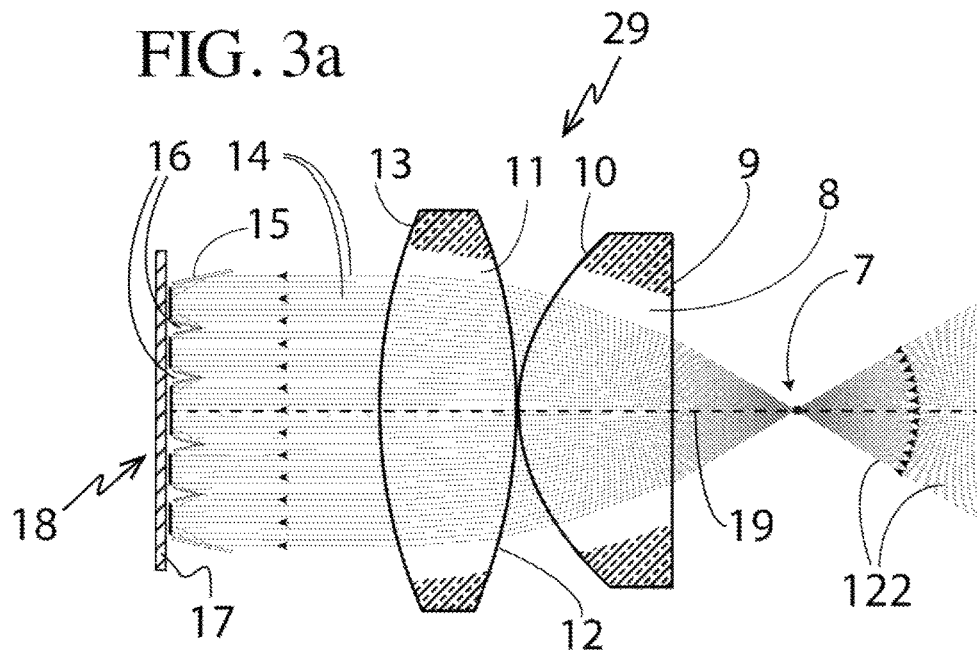
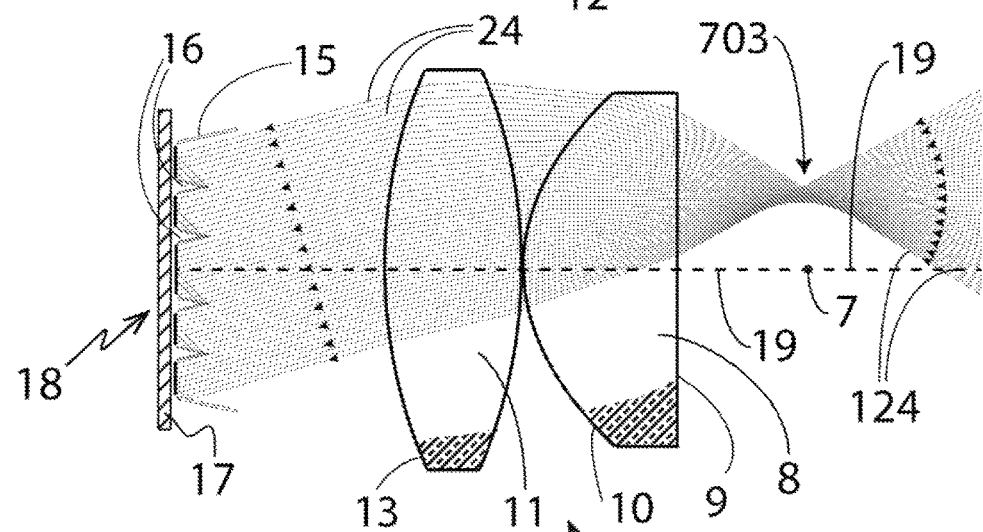

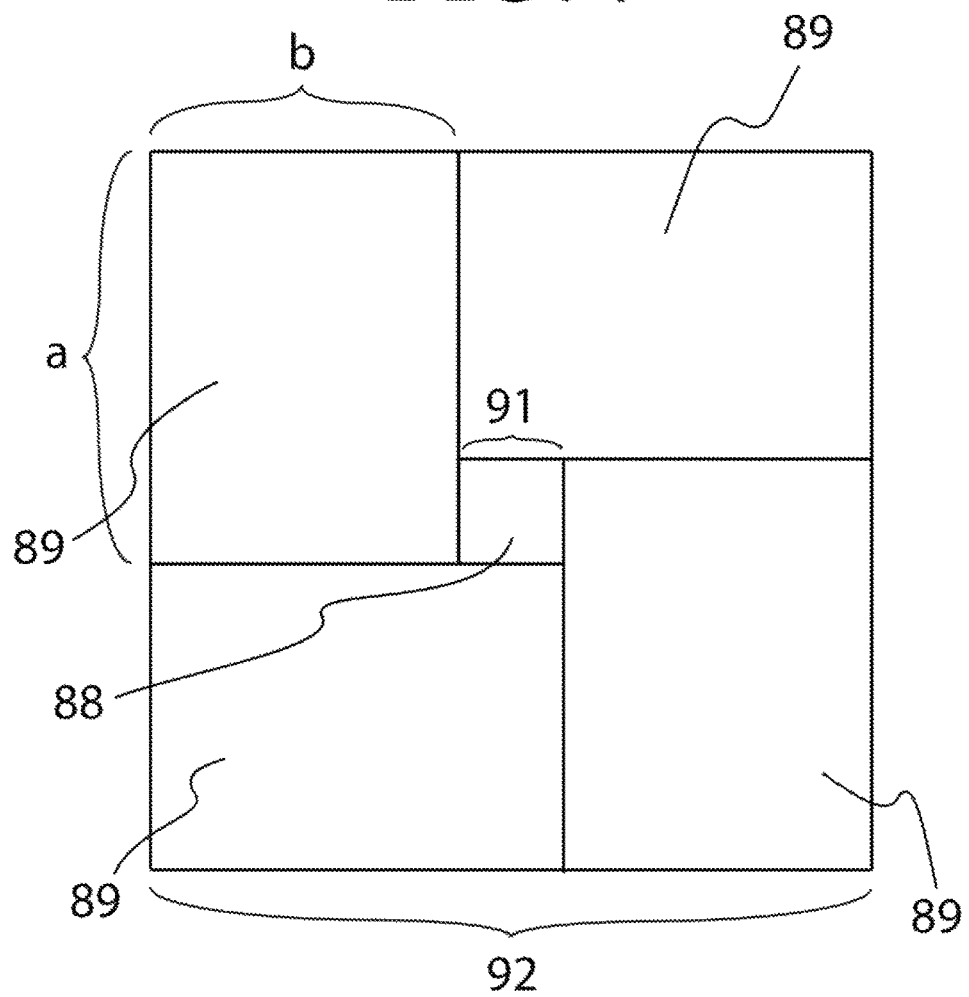

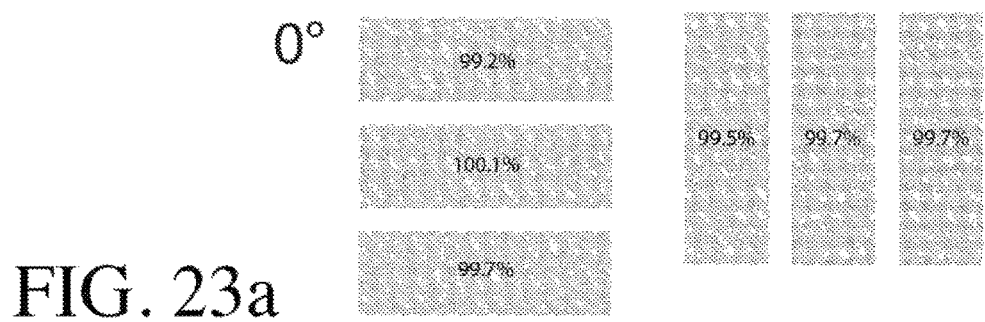
FIG. 23a
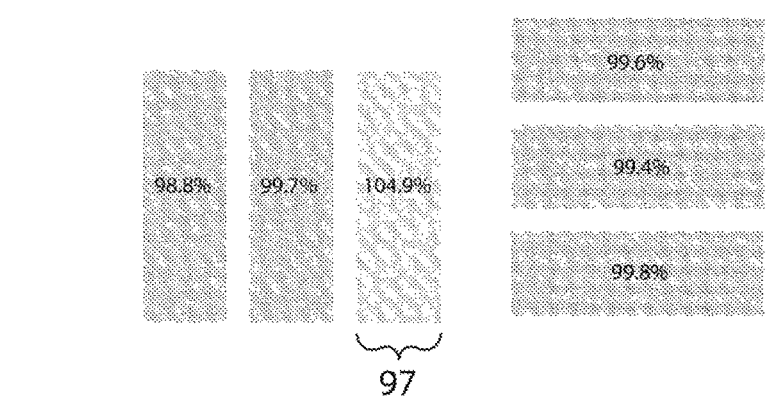
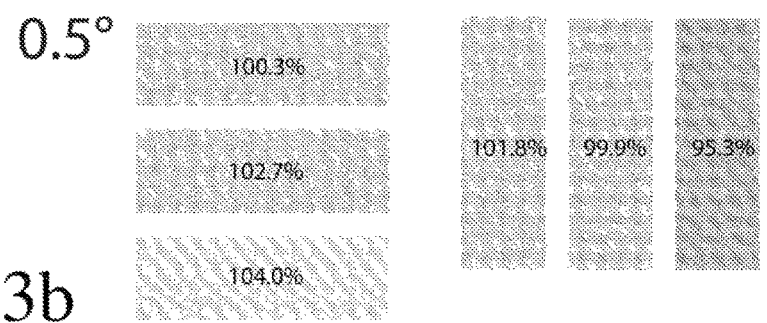
FIG. 23b

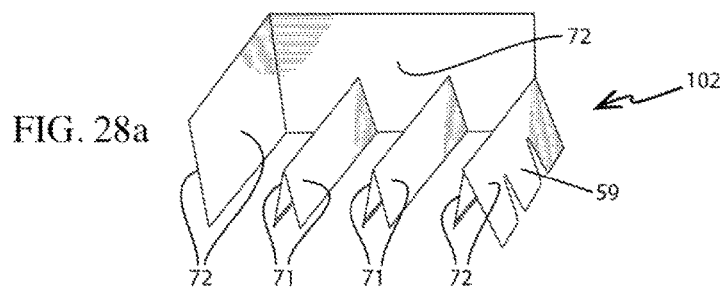
FIG. 28a
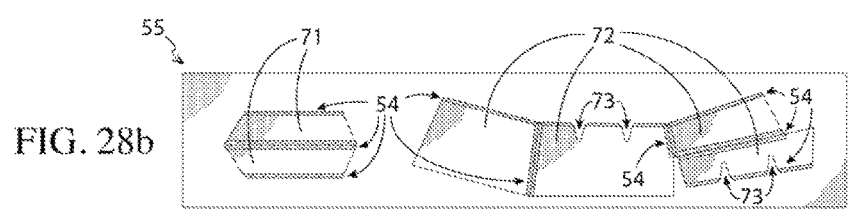
FIG. 28b
FIG. 28c 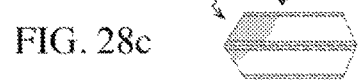 FIG. 28f
FIG. 28d  FIG. 28g
FIG. 28e 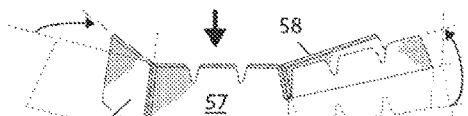 FIG. 28h
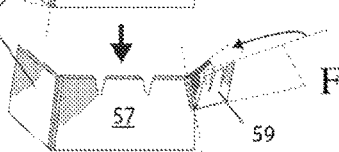
FIG. 28j 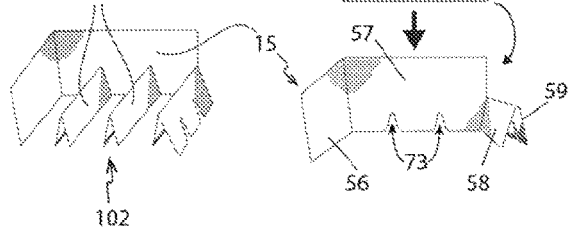 FIG. 28i

SOLAR GENERATOR WITH LARGE REFLECTOR DISHES AND CONCENTRATOR PHOTOVOLTAIC CELLS IN FLAT ARRAYS

CROSS REFERENCE TO RELATED APPLICATIONS

This application is a U.S. National Phase filing under 35 U.S.C. § 371 of PCT/US2013/071974, filed on Nov. 26, 2013, which claims priority to U.S. Provisional Patent Application Ser. No. 61/797,168 filed on Nov. 30, 2012, both of which are incorporated herein by reference in their entirety.

BACKGROUND OF THE INVENTION

In the past, solar generators aimed at exploiting the high efficiency of multi-junction solar cells to generate electricity typically employed many small solar focusing optical systems for each individual photovoltaic cell. Such generators were deficient in that the packaged assemblies of numerous optical systems and cells were both large and complex, and consequently suffered from a relatively high cost that made such solar generators uncompetitive with alternative methods of generating electricity. Such generators also required large, unique facilities for their manufacture, and were expensive to transport from the factory to an installation site.

Some previous designs of solar generators have been disclosed that use single large reflectors to power arrays of multi-junction photovoltaic cells. U.S. Patent Application Publication No. 2011/0168234, by John Lasich, titled "Photovoltaic Device for a Closely Packed Array," describes a solar generator with a densely-packed array of solar cells near the focus of a large paraboloidal reflector dish. Planar mirrors are arranged around the perimeter of a densely packed array. One drawback of the proposed configuration by Lasich is that no provision is made to direct light away from the light-insensitive electrical connections on the front surface of the arrayed cells, causing losses and reduced efficiency. Another drawback is that the illumination is not uniformly distributed across the array, causing loss of power when individual cells are connected in series. Yet another drawback is that small mispointing of the optical axis away from the sun would cause the illumination to become more uneven, further reducing power output. Lasich proposes the use of stiff, heavy trackers to mitigate this problem by maintaining accurate pointing, but such trackers drive up cost.

U.S. Pat. No. 8,350,145, by Roger P. Angel, titled "Photovoltaic Generator with a Spherical Imaging Lens for Use with a Paraboloidal Solar Reflector," uses a spherical ball lens at the focus of a paraboloidal dish reflector. The lens stabilizes the light against mispointing at the image of the dish reflector, formed on a concave surface, and tiled with tapered optical funnels. At each funnel output, the light is distributed into discrete square regions, with a photovoltaic cell located at each region.

However, because the apparatus disclosed in U.S. Pat. No. 8,350,145 relies on spherical symmetry to realize equal apportionment of sunlight to a plurality of photovoltaic cells arranged in a concave array, the cells and optical funnels are configured in a concave array. In practice, the manufacturing costs involved in making curved reflecting surfaces and supporting structures for the concave array of photovoltaic cells have been relatively high. In addition, the lens itself is preferably made as a full sphere (ball lens), and both the optical funnels and the photovoltaic cells are deployed on concentric concave spherical surfaces. Some embodiments use photovoltaic cells of many different shapes and sizes to tile the spherical surface, and in practice, this added complexity has increased costs. Some embodiments use identical square cells, but complex funnel shapes are configured to fit together seamlessly to tile a spherical surface at their input, and to match the square cell dimension at their output. In practice, such embodiments have been relatively expensive to manufacture, because the funnels are manufactured with many different odd shapes to fit together, and the individual reflective surfaces of a funnel, instead of being flat, are twisted to bring the light from an odd entrance shape to a square output to match the square photovoltaic cell. In addition, providing the funnel surfaces with high specular reflectance, and subsequent coating for very high reflectivity, tend to be more expensive to manufacture.

Mounting photovoltaic cells to conform to a spherical surface may be problematic. If individual flat photovoltaic cells are to be mounted individually on electrically insulating but thermally conductive substrates, and such substrates to be attached to a concave, faceted surface, with the facets tangent to a sphere, the mounting process is further complicated by the additional requirement for transfer of high flows of both heat and electricity from the substrates.

In some prior designs, compensation for shadowing of a primary mirror by a central assembly of secondary optics and any supporting structure is achievable only by eliminating partly blocked cells from a series-connected chain. This may waste light, and consequently lead to reduced efficiency and power output.

It follows that many prior designs have suffered from relatively high manufacturing costs. In addition, some prior designs may have inevitable light blockages that break the continuous sunlight beam from a primary reflector, and as a result, may cause current imbalances and reduced power output. There is therefore room for improvement.

SUMMARY OF THE INVENTION

The present invention is an apparatus for generation of solar electricity by focusing sunlight onto small multi-junction photovoltaic cells having exceptionally high conversion efficiency. The invention addresses the key requirement for solar generation, namely low manufacturing cost and high overall efficiency. To this end, the apparatus includes a large paraboloidal mirror of back-silvered glass, turned to the sun throughout the day, so as to provide an intense focus. Solar reflectors of large back-silvered glass segments already used extensively to concentrate sunlight for solar thermal generation have been proven to have long life in field operation and are relatively inexpensive per unit of solar power brought to a focus. However, to exploit such large collectors in an economical system, it is necessary to inexpensively convert into electricity the powerful sunlight provided at the focus. The conversion cannot be accomplished by a single high-efficiency multi-junction cell placed at the focus, as is common for cells used with small lens collectors, because the electrical current would be so large as to cause a single cell to fail.

This invention provides for efficient operation of multi-junction photovoltaic cells at the powerful focus, by dividing the light to illuminate multiple small cells, each operating at a safe, reduced current. The secondary optics of the invention located near the powerful focus are configured so as to distribute the light without loss into individual separate regions each matched to the size of a single cell, or small group of parallel-connected adjacent cells acting as a single large cell. These regions are set slightly apart, so as to provide room for electrical connections between the cells or groups. The secondary optics of this invention provide for equal division of light between all the series-connected cells or groups. This equality is required for efficient power generation by simple series connection of the cells, because in such connection, power is lost unless the photovoltaic current, and therefore the amounts of light received by all of the individual cells, is very nearly equal.

A particular feature of the optical design of this invention is its matching of the secondary optical system specifically to the particular pattern of illumination of the primary reflector. This matching is required in a practical system to ensure equal division of light between the cells or groups despite the uneven illumination of the primary collector. Such unevenness is inevitable in practice because of local shadowing of a large axisymmetric reflector by system elements blocking the sun ahead of it.

A second feature is to maintain balance despite slight mispointing of the apparatus away from the sun. Maintaining such balance is needed to avoid the cost for heavy solar trackers needed to point accurately in the wind.

A third important feature of this invention is that the regions of equal concentrated sunlight output by the secondary optics are matched to cell size are arranged to be co-planar (not on a spherical surface), so that the cells may be grouped on flat circuit cards. This is done to reduce manufacturing cost, because flat circuit cards are simple to assemble with photovoltaic cells and the other circuit elements, by methods well developed in the electronics industry. Flat cards are also conveniently adapted for active cooling with thermal transfer liquid, needed to keep the cells cool despite high thermal loads.

A fourth important feature of this invention is the design of the secondary optics, in which a lens is combined with secondary reflecting elements in the form of sharp-edged wedges to cleanly separate the light directed toward different cells. The wedges are readily made from sheets of inexpensive flat material that has been pre-polished to a high specular finish and silvered and overcoated for both very high solar reflectivity and long-term resistance to tarnishing. In one aspect assemblies of multiple wedges are made as "origami optics". The flat retlecting material is deeply grooved along fold lines such that when folded it forms multiple, sharply defined reflector wedges in the correct geometrical configuration to illuminate multiple cells. This method is inexpensive and yields wedge arrays of very high optical throughput.

Two embodiments are shown which differ in their configurations of cells and secondary optics within the power conversion units.

In the first, the cells are configured in a single planar array. The secondary optics to distribute the focused light evenly across the flat surface include a telecentric entrance lens with two elements, one having an aspheric surface.

In the second embodiment, the cells are configured in four planar quadrants, tilted with respect to each other. In this case, the secondary optics include a single element entrance lens.

In both embodiments, the lens serves both as an entrance window to a sealed chamber containing the wedge reflectors and photovoltaic cells and preventing contamination. The lens reformats the light into an image of the primary reflector which is fixed in position within the receiver package and stabilized against pointing error. This image has a sharply defined edge and includes the detail of any obscuring elements. The stability and detail of this image make possible the subsequent division of the light so that each cell group receives the same amount despite blocked areas and mispointing. In both embodiments, the lens is constructed so as to direct rays to arrive substantially perpendicular to the planar arrays of cells. This allows the wedge reflectors to be optimized so that the light reflected down to the cells (or cell groups) remains evenly divided even when the apparatus is slightly mispointed from the sun.

BRIEF DESCRIPTION OF THE DRAWINGS

FIG. 2a is a cross-sectional view of an optical window, a lens design, and a photovoltaic cell array according to a first embodiment of the present invention.

FIG. 2b is a perspective view of the optical window, lens design, and photovoltaic cell array shown in FIG. 2a.

FIG. 3a is a linear cross-sectional view of a lens design and a photovoltaic cell array according to a first embodiment of the present invention showing on-axis rays of light.

FIG. 3b is a linear cross-sectional view of a lens design and a photovoltaic cell array according to a first embodiment of the present invention showing off-axis rays of light.

FIG. 7 is a diagram illustrating a symmetric four-fold division of a focal surface.

FIG. 10b is a plan view of the layout of a corresponding photovoltaic cell circuit card and wedge assembly depicting the area affected by the shadow of the corresponding cantilever arm and Power Conversion Unit shown in FIG. 10a.

FIG. 17b is a perspective view of the lens design and plurality of planar photovoltaic cell arrays shown in FIG. 17a.

FIG. 21b is a plan view of the layout of a corresponding photovoltaic cell circuit card and wedge assembly depicting the area affected by the shadow of the corresponding cantilever arm and Power Conversion Unit shown in FIG. 21a.

FIG. 23a is a diagram of cell illumination distribution for a second embodiment of the present invention showing on-axis illumination.

FIG. 23b is a diagram of cell illumination distribution for a second embodiment of the present invention showing off-axis illumination.

FIG. 28a is a diagram depicting a quadrant of a wedge reflector assembly.

FIG. 28b is a diagram depicting a step in a method of manufacturing a quadrant of a wedge reflector assembly.

FIG. 28c is a diagram depicting a step in a method of manufacturing a quadrant's interior wedge reflector.

FIG. 28d is a diagram depicting a step in a method of manufacturing a quadrant's interior wedge reflector.

FIG. 28e is a diagram depicting a step in a method of manufacturing a quadrant's interior wedge reflector.

FIG. 28f is a diagram depicting a step in a method of manufacturing a quadrant's perimeter wedge reflector.

FIG. 28g is a diagram depicting a step in a method of manufacturing a quadrant's perimeter wedge reflector.

FIG. 28h is a diagram depicting a step in a method of manufacturing a quadrant's perimeter wedge reflector.

FIG. 28i is a diagram depicting a step in a method of manufacturing a quadrant's perimeter wedge reflector.

FIG. 28j is a diagram depicting a step in a method of manufacturing a quadrant of a wedge reflector assembly.

DETAILED DESCRIPTION OF PREFERRED EMBODIMENTS

Figure 1:
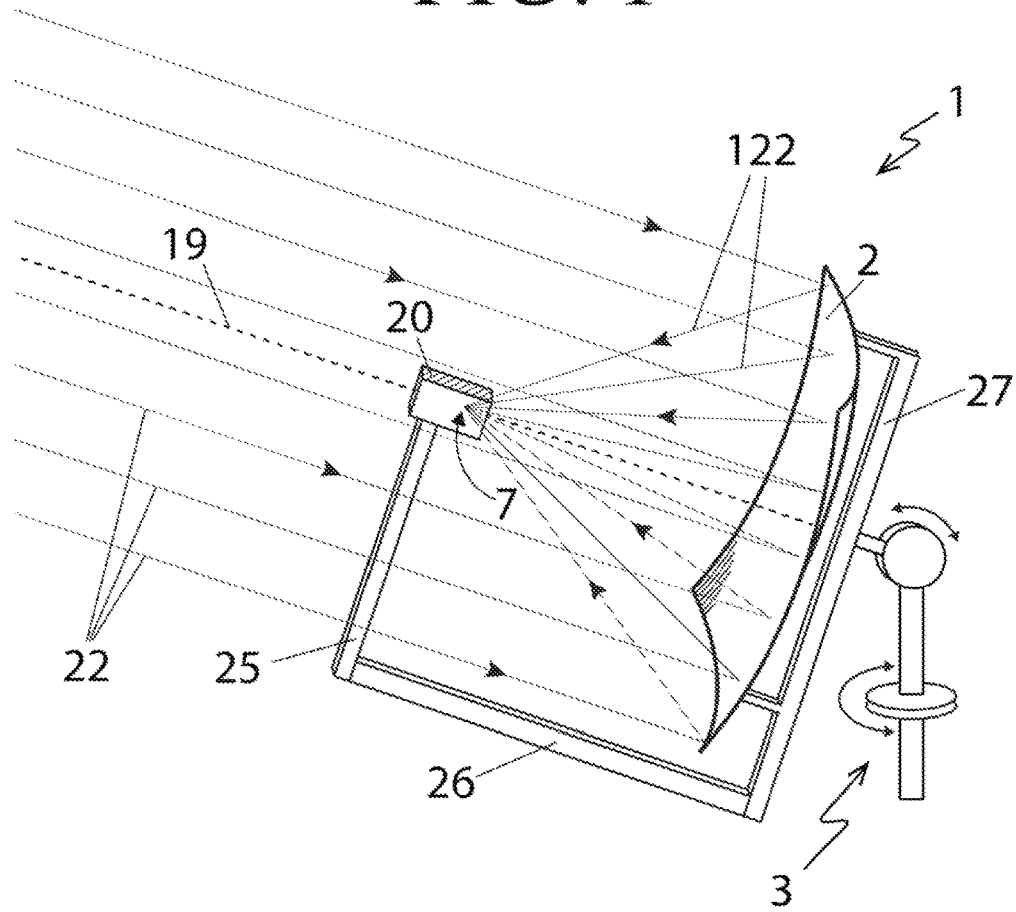
FIG. 1 is a schematic diagram of a solar concentrating apparatus according to the present invention, supported on a two-axis tracking mount.

FIG. 1 is a schematic diagram of a solar concentrating apparatus 1 according to the present invention, supported on a two-axis tracking mount 3. A substantially square paraboloidal dish reflector 2 has an axis 19, and incoming sunlight 22 striking the dish reflector 2 is reflected in the direction indicated by rays 122 shown in FIG. 1 to a focus 7. During operation, the axis 19 of the reflector 2 is aligned to the direction of the sun by a dual-axis mount 3, so that sunlight reaching the dish reflector 2 is concentrated at the focus 7.

The converging rays 122 of sunlight enter a Power Conversion Unit 20, or PCU 20, positioned near the focus 7. The focused sunlight entering the PCU 20 is converted into electricity by the PCU 20. The PCU 20 is supported by an arm 25 which is attached to a cantilevered post 26. The cantilevered post 26 is rigidly attached to a support structure 27. The reflector 2 is also disposed upon or attached to the support structure 27. In this way, the PCU 20 is constrained to remain aligned with the focus 7 of the reflector 2.

The PCU 20 comprises a plurality of photovoltaic cells 30 configured in one or more planar arrays. The PCU 20 includes secondary optics comprising a single or compound lens 29 which is positioned near the focus 7, together with sharp wedge reflectors 16. The secondary optics are configured so that the lens 29 and the wedge reflectors 16 cooperate to apportion the sunlight from the dish reflector 2 onto the plurality of photovoltaic cells 30 in substantially equal amounts so that the photovoltaic cells 30 generate substantially equal electrical current when illuminated with sunlight. In a first embodiment, the lens 29 comprises a compound telecentric lens 29 as shown in FIG. 2a, FIG. 2b, FIG. 3a, and FIG. 3b. In a second embodiment, the lens may be a single lens such as the double convex lens 70 shown in FIG. 17a, FIG. 17b, FIG. 18a, and FIG. 18b.

The example shown in FIG. 1 depicts a single dish reflector 2 and PCU 20 carried by a single dual-axis mount 3. However, it should be understood that a plurality of dish reflectors 2, each having a corresponding PCU 20, may be mounted upon a single rigid support structure 27 on a two-axis mount 3 as shown, for example, in FIG. 35.

First Embodiment

As shown in FIG. 1, solar rays 22 parallel to the axis 19 are reflected by the large reflector 2, and the reflected solar rays 122 converge upon the focus 7. Turning now to FIG. 2a, the reflected rays 122 pass through the focus 7 and impinge upon the lens 29. In accordance with a first embodiment of the present invention, the lens 29 shown in FIG. 2a is a telecentric lens 29.

FIG. 2a shows details of components comprising the PCU 20 according to a first embodiment of the present invention. In the illustrated example, a flat window 6 forms the entrance to the PCU 20. Within the PCU 20 and behind the window 6, is a two-element telecentric lens 29, a plurality of wedge reflectors 16, and a single planar array 18 of photovoltaic cells 30, which generate electricity. In this example, the telecentric lens 29 comprises a first piano-convex element 8, having a flat entrance surface 9 and a convex aspheric back surface 10. The telecentric lens 29 further comprises a second lens element 11 which is a double convex lens element 11, having a spherical entrance surface 12 and an exit surface 13. Although FIG. 2a shows a two element compound lens as the illustrated example of a telecentric lens 29, it should be understood that the telecentric lens 29 may comprise other telecentric multi-element lens designs in which the chief rays are collimated and parallel to the optical axis in image space and provide uniform image plane illumination.

The reflector 2 (not shown) would be located off to the right of FIG. 2a, and the reflected rays 122 converge to the PCU 20. These converging rays 122 pass through the flat window 6, and generally converge to the focus 7. The sun is not a point source of light. Instead, the sun is a disc as seen from planet Earth. FIG. 2a shows additional converging rays 4 which originate from the top edge of the sun's disc, and converge to a corresponding focal point 701. FIG. 2a shows additional converging rays 5 which originate from the bottom edge of the sun's disc, and converge to a corresponding focal point 702.

The telecentric lens 29 forms a flat, square image of the primary reflector 2 as shown by the dashed line 23 in FIG. 2a. Each of the sharp wedge reflectors 16 is located with its apex 50 in the image plane 23. The sharp wedge reflectors 16 function to direct rays 4 and 5 away from gaps between the photovoltaic cells 30 in the array 18. Perimeter reflectors 15 surround the wedge array perimeter, to bring edge rays onto the photovoltaic cells 30 around the perimeter of the array 18.

FIG. 2b shows the main elements of the PCU 20 in perspective: the entrance window 6, the first lens element 8 and the second lens element 11 of the compound telecentric lens 29, and a secondary array assembly 17 which includes the wedge reflectors 16, the perimeter reflectors 15, and the planar cell array 18.

The telecentric lens 29 used in the first embodiment is designed to have three characteristics that are important for the efficient operation of the apparatus 1. First, the lens 29 reformats the concentrated light at the focus 7 of the primary reflector 2 into a sharply defined image 23, which is stabilized against mispointing and is also flat, and thus matched to the flat cell array 18. This allows high efficiency coupling of the concentrated sunlight to a flat array of photovoltaic cells 18.

Second, the lens 29 is free of distortion. As a result, solar rays 22 which are evenly spaced on entering the apparatus 1 are also evenly spaced as they form the image 23. Freedom from distortion is highly desirable, since it results in the concentrated sunlight having substantially uniform brightness at the image plane 23 near to where the cells 30 and the wedge reflectors 16 are located. A second valuable attribute of the distortion free telecentric lens 29 is that the image 23 has the same shape as the primary reflector 2, namely square, so it can efficiently be coupled to the array 18 of square or rectangular photovoltaic cells 30.

The third important characteristic of the telecentric lens 29 is to redistribute the concentrated sunlight as a collimated beam 14 substantially perpendicular to the image plane 23, as shown in FIG. 3a. FIG. 3a shows rays originating from a distant point aligned with the optical axis 19 of the apparatus 1, for example, the center of the sun's disc. Sun rays 22 enter the apparatus parallel to each other and to the axis 19, as shown in FIG. 1. After reflection by the primary reflector 2, these rays 122 are brought to a point focus 7. Referring now to FIG. 3a, after passage through the telecentric lens 29, the rays 14 have been refracted to be parallel to the axis 19 of the reflector 2. This is a result of the telecentricity of the lens 29. The rays 14 thus strike the planar cell array 18 at normal incidence, which is perpendicular to the photovoltaic cells 30.

FIG. 3b illustrates an example of rays 124 from a distant point not aligned with the optical axis 19. This may be the result of the reflector 2 not being pointed directly at the sun. In this case, the rays 124 converge on a point 703 which is displaced away from the optical axis 19. But after refraction by the telecentric lens 29, the rays 24 strike the wedge reflectors 16 and the cell arrays 18 in nearly the same square image area 23 as the example shown in FIG. 3a. The telecentric lens 29 compensates for the mispointing of the reflector 2. The rays 24 also remain parallel to each other and uniformly spaced, although tilted to the axis 19. Uniform distribution of sunlight across the photovoltaic cells 30 and wedge array 18 is thus maintained even when the reflector 2 is slightly mispointed away from the sun.

It will be understood by those with skilled in the art that the two element lens 29 illustrated in this example is simply one example of a telecentric lens 29 with flat field and freedom from distortion. Other telecentric lens configurations using two or more elements to achieve these properties may be employed without departing from the scope of the present invention. Similarly, lenses with different prescription may be designed to accommodate dish reflectors with different focal ratio and dimensions may be used.

The telecentric lens elements 8 and 11 are preferably of fused quartz, to minimize light loss and heating by absorption of the highly concentrated sunlight. Preferably to avoid contamination of the front lens surface 9, the PCU 20 is provided with an entrance window 6, where the flux levels are reduced and less likely to result in burned-on contamination. In a preferred first embodiment using these materials, antireflection coatings may be applied to the four lens surfaces 9, 10, 12 and 13 and to both sides of the window 6.

An important feature of the present invention is that the secondary optics accommodate mispointing errors. The telecentric lens 29 used in the secondary optics functions so that the rays of sunlight reaching the photovoltaic cells 30 are either perpendicular to the flat cell array 18, or have only a limited range of ray angles away from perpendicular. The wedge reflectors 16 and the perimeter reflectors 15 used in the secondary optics, positioned just above the photovoltaic cells 30, function to direct light away from gaps between the photovoltaic cells 30 and light insensitive areas on the photovoltaic cells 30, and direct that light onto the light sensitive areas of the photovoltaic cells 30 that are operative to convert the light into electricity.

Figure 4:
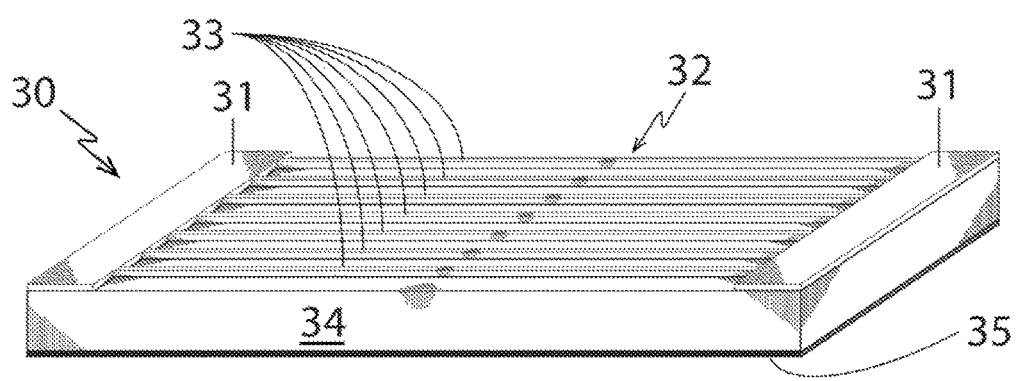
FIG. 4 is a perspective view of an individual photovoltaic cell.

FIG. 4 shows a perspective view of a single multi-junction photovoltaic cell 30 used in the array of cells 18. Each photovoltaic cell 30 is made on a square or rectangular substrate 34, and has a photovoltaically active front area 32. The electrical current created at the cell's front surface 32 flows from the metallization on the back 35 of the cell, the positive electrode 35, through the cell 30 to the active area 32 where it is transmitted via thin surface conductors 33 to metallic edge busbars 31, the negative electrodes 31. The very high efficiency of the photovoltaic cells 30 is in part a result of their use of current collecting busbars 31 on both sides of the cell 30, to split the current and reduce ohmic losses in the thin surface conductors 33. However, the two metallic busbars 31 are opaque and insensitive to sunlight. In accordance with the present invention, wedge reflectors 16 are used to steer incoming sunlight away from the busbars 31 onto the cell active area 32, and thereby avoid wasted sunlight.

Figure 5:
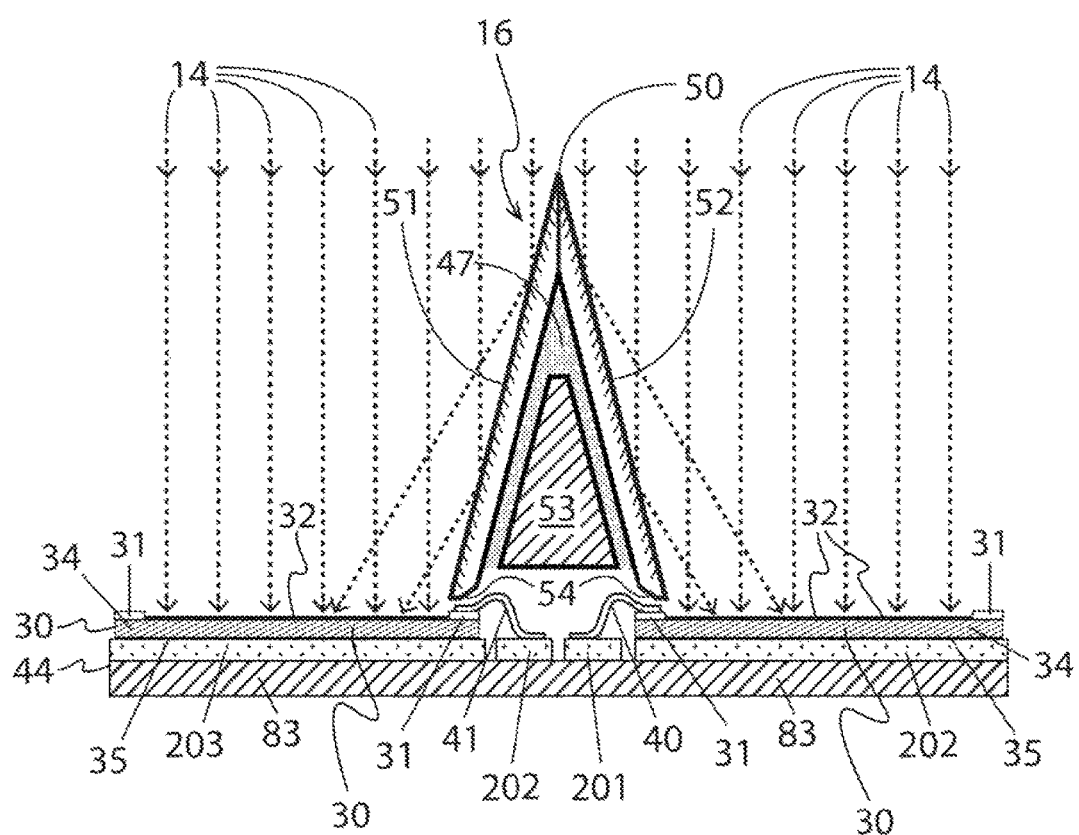
FIG. 5 is a schematic diagram illustrating a cross-sectional view of a reflective wedge over wiring between adjacent photovoltaic cells.

FIG. 5 shows a cross-section view of a wedge reflector 16 located above the busbars 31 of two adjacent photovoltaic cells 30 of the array 18. The wedge reflector 16 has a first planar reflective side surface 51 and a second planar reflective side surface 52 that meet at a sharp wedge knife-edge apex 50. In FIG. 5, the illustrated rays 14 of sunlight have been reflected by the reflector 2 and passed through the telecentric lens 29 in the case of on-axis illumination. The parallel, on-axis rays of light 14 from the telecentric lens 29 that are incident on the wedge reflector 15 are re-directed to photovoltaically-active areas 32 of the photovoltaic cells 30. Consequently, the re-directed light contributes to the electricity generated by the photovoltaic cells 30. If instead, the wedge reflector 16 was not used, and rays of light were to be allowed to impinge upon the busbars 31, no electricity would be generated from such light striking the busbars 31.

As shown in FIG. 5, the photovoltaic cells 30 are mounted via their back metallization 35 to a first electrically conductive land 203 and a second electrically conductive land 202, which are both attached to an electrically insulating planar substrate 83. The cell circuit card 44 comprises the substrate 83 and a plurality of conductive lands 201, 202, 203 and 204. In the gap between the photovoltaic cells 30, there is a third strip of a land 201 and a fourth strip of a land 202. Electrical connection between the busbars 31 is made to the third strip of land 201 by first wirebonds 40, and electrical connection is made to the fourth strip of land 202 by second wirebonds 41.

To provide a thermal pathway for the surfaces of the thin wedge reflector sides 51 and 52 to transmit their absorbed heat, the inside of the wedge reflector 16 is bonded via thermal adhesive 47 to a thermally conductive wedge support structure 53. This wedge support structure 53 not only provides a thermal pathway for a plurality of wedge reflectors 16 on a photovoltaic cell array 18, but also acts as a mechanical skeleton support to locate the wedge reflectors 16 accurately above and between the photovoltaic cells 30. In order to prevent electrical contact of the first and second wirebonds 40 and 41 to the wedge reflector 16, the wedge reflector sides 51 and 52 have undercuts 54 provided, and the underside of the wedge support structure 53 is raised to clear the first and second wire bonds 40 and 41.

Figure 6A:
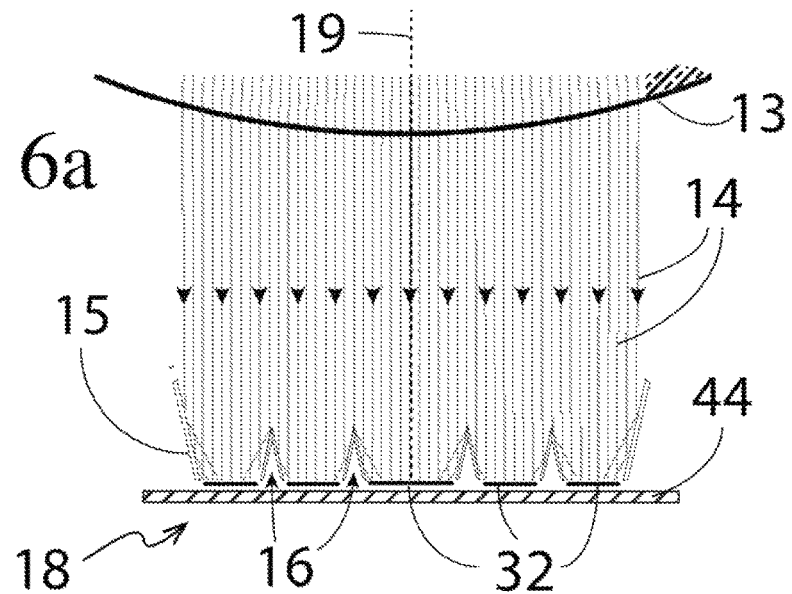
FIG. 6a is a schematic diagram illustrating on-axis rays impinging upon an array of wedges and photovoltaic cells according to FIG. 5.

FIG. 6a a schematic diagram illustrating on-axis rays impinging upon an array of wedge reflectors 16 and photovoltaic cells 30. FIG. 6a illustrates the action of wedge reflectors 16 under illumination by parallel light rays from the exit surface 13 of the telecentric lens 29 for the case of light entering the reflector 2 on-axis relative to axis 19. In FIG. 6a the rays 14 striking the first and second side surfaces 51 and 52 of the wedge reflectors 16 are reflected to the active areas 32 of the photovoltaic cells 30, brightening the illumination equally along both sides of these active areas 32.

Figure 6B:
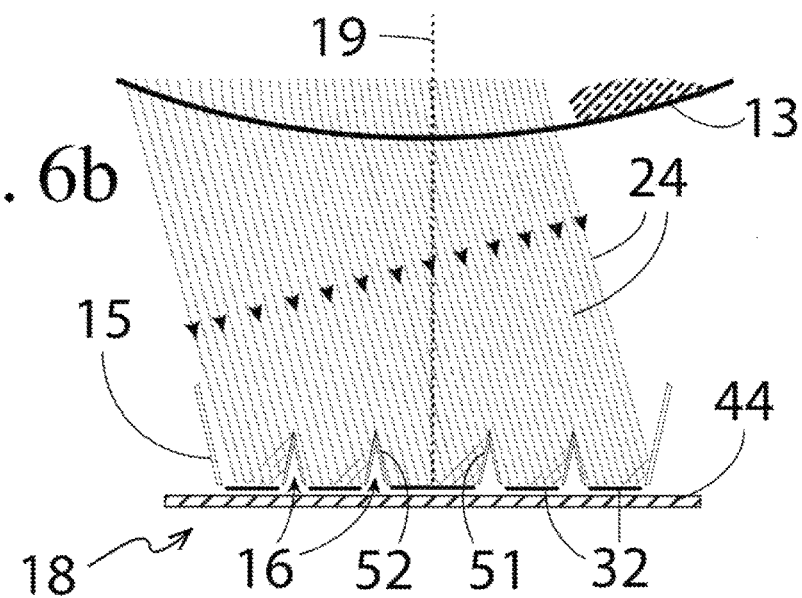
FIG. 6b is a schematic diagram illustrating off-axis rays impinging upon an array of wedges and photovoltaic cells according to FIG. 5.

FIG. 6b illustrates the action of wedge reflectors 16 under illumination by parallel light rays from the exit surface 13 of the telecentric lens 29 for the case of light entering the reflector 2 off-axis. In FIG. 6b, the tilted rays 24 strike only the first wedge surfaces 51 on one side of each wedge reflector 16 and are reflected further across the active areas 32 of the photovoltaic cells 30, brightening the illumination across most of the active cell areas 32. FIG. 6b graphically shows the importance of the telecentric lens 29 in controlling the range of angles of the rays 24 so that the light rays 24 are close to normal to the planar cell array 18. Without the telecentric lens 29, light rays 24 at too large of an angle to normal, after reflection by the wedge reflectors 16, would be reflected away from the active cell areas 32 and thus not generate electricity. Thus, the telecentric lens 29 and the wedge reflectors 16 together comprise secondary optics that maintain high and substantially uniformly divided illumination of the photovoltaic cells 30 even when the reflector 2 is not accurately pointed at the sun.

As shown in FIG. 2a, the knife edges 50 of the reflective wedges 16 are located in a plane that is essentially coincident with the plane of the flat image 23 of the dish reflector 2 formed by the telecentric lens 29. In this way, essentially all of the light rays from the primary dish reflector 2 passing through the telecentric lens 29 are directed to photovoltaic active areas 32 of the photovoltaic cells 30, even for misalignment as in the example shown in FIG. 6b for off-axis rays 24.

A preferred example of the full optical system of the first embodiment that optimizes performance of the system, comprising a dish reflector 2, telecentric lens 29, wedge reflectors 16, and a planar array 18 of photovoltaic cells 16, is described below. In this preferred example, FIG. 7 shows how the cells in a planar array 18 may be laid out as four substantially identical and symmetrically placed rectangles 89 having a length "a" and a width "b", which are arranged specifically to match both the image 23 of the dish reflector 2, and to leave a square hole 88, having a length indicated by reference numeral 91, at the center. This hole 88 may for example correspond to the central shadow cast on the primary dish reflector 2 by the PCU 20. This layout is configured to avoid uneven illumination of the photovoltaic cells 30 that would arise if shadowing by the PCU 20 was not taken into account. This central area 88 may be tailored to different sizes by changing the length "a" and width "b" of the rectangle 89 designated for the parallel cell groups 36 in each quadrant, for example by adjusting the geometry and gap width of the cells in the groups 36.

Figure 8A:
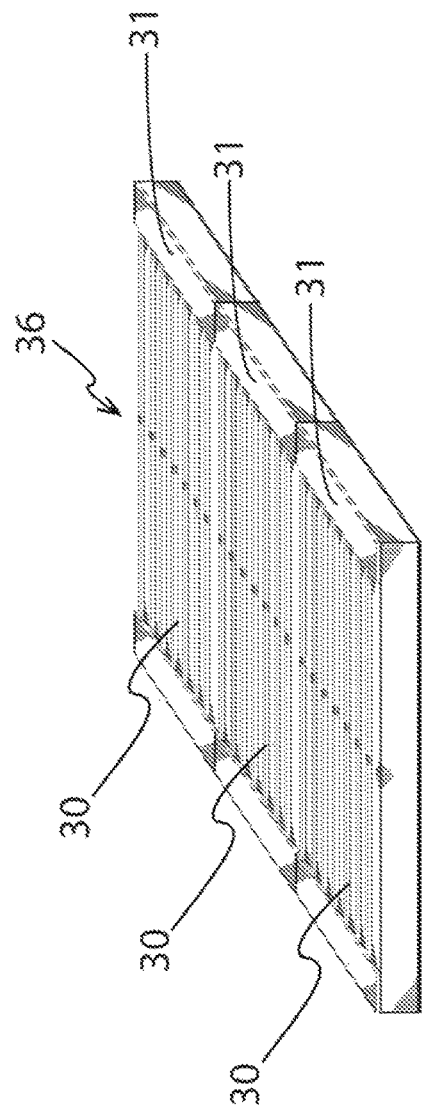
FIG. 8a is a perspective view of three adjacent photovoltaic cells.
Figure 8B:
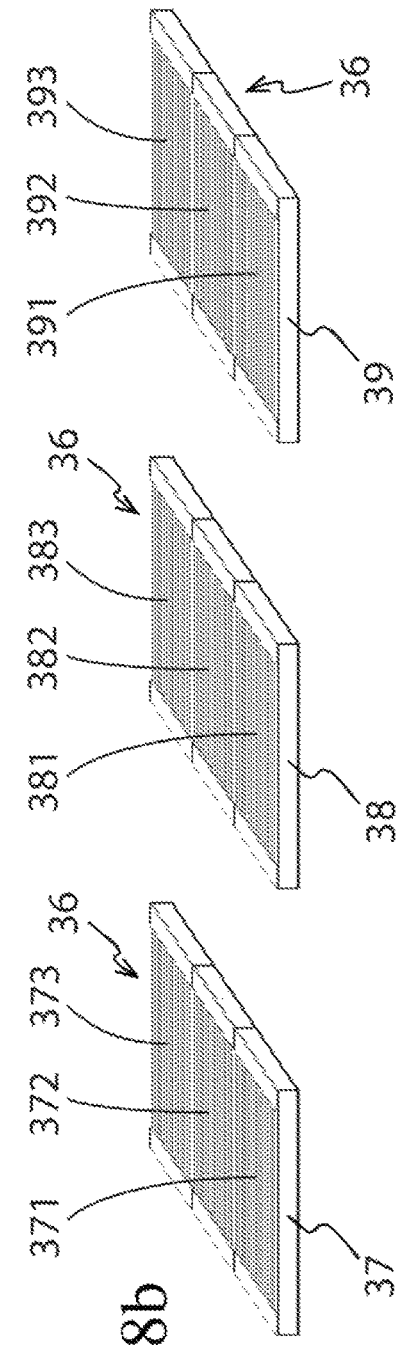
FIG. 8b is a perspective view of three groups of three adjacent photovoltaic cells.

FIG. 8a and FIG. 8b illustrate a configuration of photovoltaic cells 30 in one of the rectangles 89 for this preferred example of the first embodiment. As FIG. 8a illustrates, groups 36 of photovoltaic cells 30 are configured with three individual cells 30 connected in parallel so their light sensitive areas form a rectangular area, and the group 36 is electrically connected to essentially perform like a single rectangular cell. The individual photovoltaic cells 30 are oriented with their busbars 31 running along the long edges of the rectangular array 36 so as to facilitate electrical connection in parallel to form the group 36. It will be understood by those skilled in the art that the function of the cell group 36 could alternatively be accomplished with a single long rectangular cell, or with two rectangular cells placed end to end. FIG. 8b illustrates three parallel groups 36 of cells 30 placed next to each other to form a first group 37, a second group 38, and a third group 39, that will be connected electrically in series to form cell configuration in on rectangle 89.

Figure 9A:
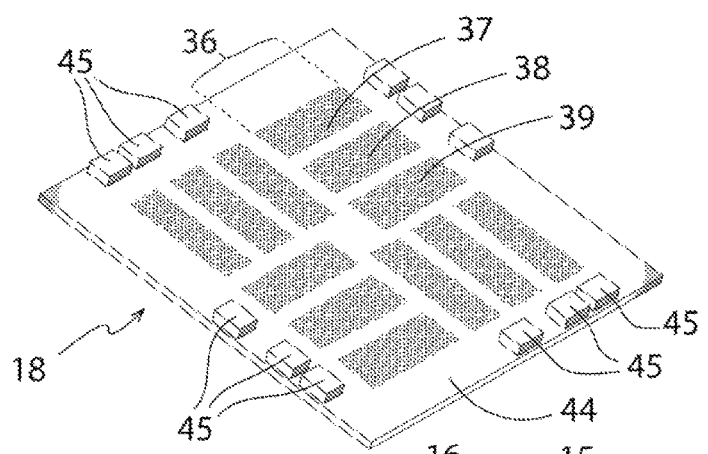
FIG. 9a is a perspective view of a photovoltaic cell circuit card.

FIG. 9a shows the location of twelve cell groups 36 of cells on a flat circuit card 44 conforming to the layout of the four rectangles 89 shown in FIG. 7. Also shown in FIG. 9a are bypass diodes 45 included on the flat circuit card 44. Each rectangle area 89 forms a quadrant of nine photovoltaic cells 30 arranged in three cell groups 36, where each group 36 has three photovoltaic cells 30. The three cell groups 36 comprise a first outer group 37, a second middle group 38, and a third inner group 39, as illustrated in FIG. 8a. The twelve cell groups 36 are all connected in series by the circuit on the flat circuit card 44. In this symmetric arrangement of electrically connected photovoltaic cells 30, balanced photocurrent in the series chain is achieved by dividing the light evenly between the first outer group 37, the second middle group 38, and the third inner group 39.

Figure 9B:
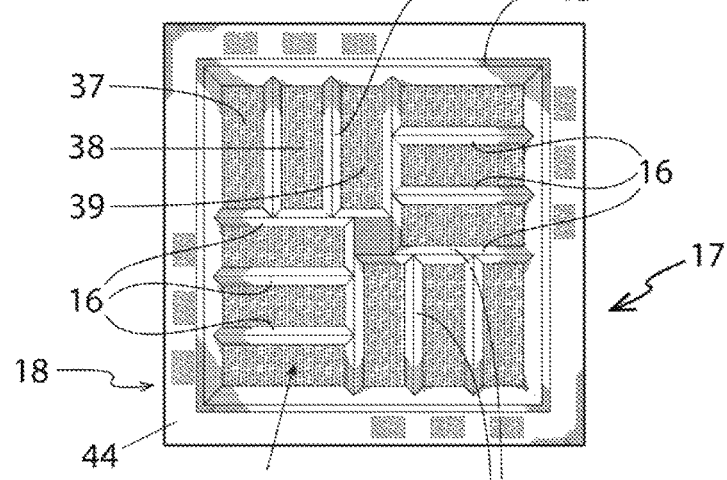
FIG. 9b is a plan view of the photovoltaic cell circuit card shown in FIG. 9a with a wedge assembly framing the photovoltaic cells.
Figure 9C:
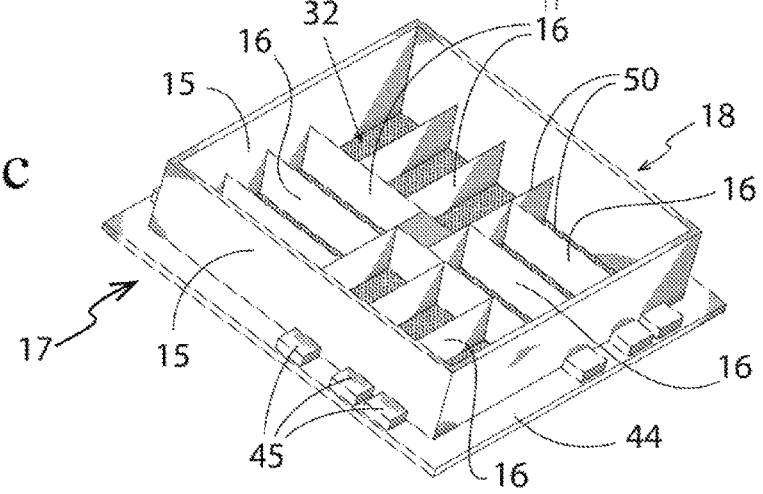
FIG. 9c is a perspective view of the photovoltaic cell circuit card and wedge assembly shown in FIG. 9b.

FIG. 9b and FIG. 9c show an array of wedge reflectors 16 located above the light-insensitive areas between the photovoltaic cells 30 in cell groups 36. Each wedge reflector 16 is constructed and installed in accordance with the detailed illustration provided in FIG. 5. Together with the taller inward sloping reflectors 15 around the perimeter of the cell array 18, the wedge reflectors 16 direct the incoming sunlight to the photovoltaically active areas 32 of the photovoltaic cells 30 in this preferred example of the first embodiment.

The optical design of this preferred example of the first embodiment is made by adjustments to the optical parameters, which includes the power and figure of the lens surfaces 9, 10, 12, and 13, and the positions, placement and angling of the wedge reflectors 16 and perimeter edge reflectors 15. In the design process, the telecentric lens design is first optimized as an independent unit for flat field and telecentricity—such that all rays arrive parallel to each other and normal to the image surface—to give a square image 23 of the primary dish reflector 2 that is free from distortion. The design process then proceeds with changes made in the parameters of the aspheric lens 8 and double-convex lens 11 as well as the wedge reflector parameters, in order to obtain uniform power division between parallel cell groups 37, 38 and 39, for both on-axis and off-axis illumination.

As a practical matter, the PCU 20 must be supported above the center of the reflector 2. Entering sunlight will thus be blocked to some degree by the PCU 20 and its support structure 25. In the case of a support arm 25 in the example shown in FIG. 1, the loss of light will be localized below the support arm 25, and will lead to asymmetrical light distribution unless compensated in some way.

Figure 10A:
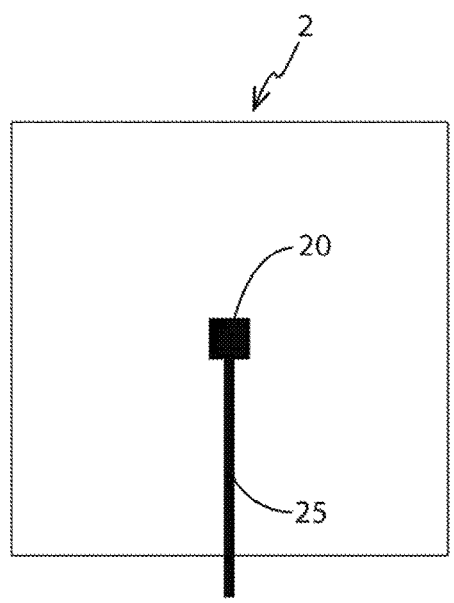
FIG. 10a is a plan view of a dish reflector and cantilever arm supporting a Power Conversion Unit in accordance with the present invention.
Figure 10B:
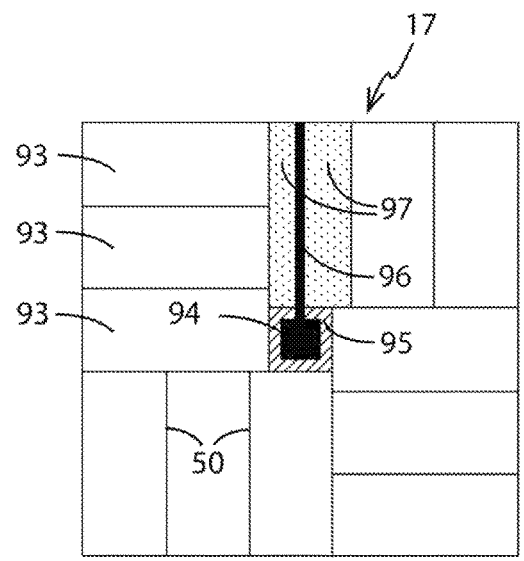

FIG. 10a is a plan view looking down the system axis 19 of a primary square reflector 2 obscured in part by a PCU 20 of square cross-section and a support arm 25. In this example, the PCU 20 outline is square, and will therefore cast a square shadow on the primary reflector 2. FIG. 10b is a plan view of the corresponding cell array 18 that employs the configuration illustrated in FIG. 9b, and shows the image formed by the lens 29 of the primary reflector 2 and the shadow of the PCU 20, and the support arm 25, in relation to the wedge reflector knife edges 50 which define the areas of light within the image plane 23 that are reflected to the different groups 36 of photovoltaic cells 30. FIG. 10b shows the region of obscuration—the image of the support arm 25 appears as a dark line 96, causing a reduction in the illumination of the cell group 97. The image of the PCU 20 shadow falls on the central region 88, but there are no photovoltaic cells 30 in this region. However, the reduction in the illumination of cell group 97 needs to be addressed.

Figure 11:
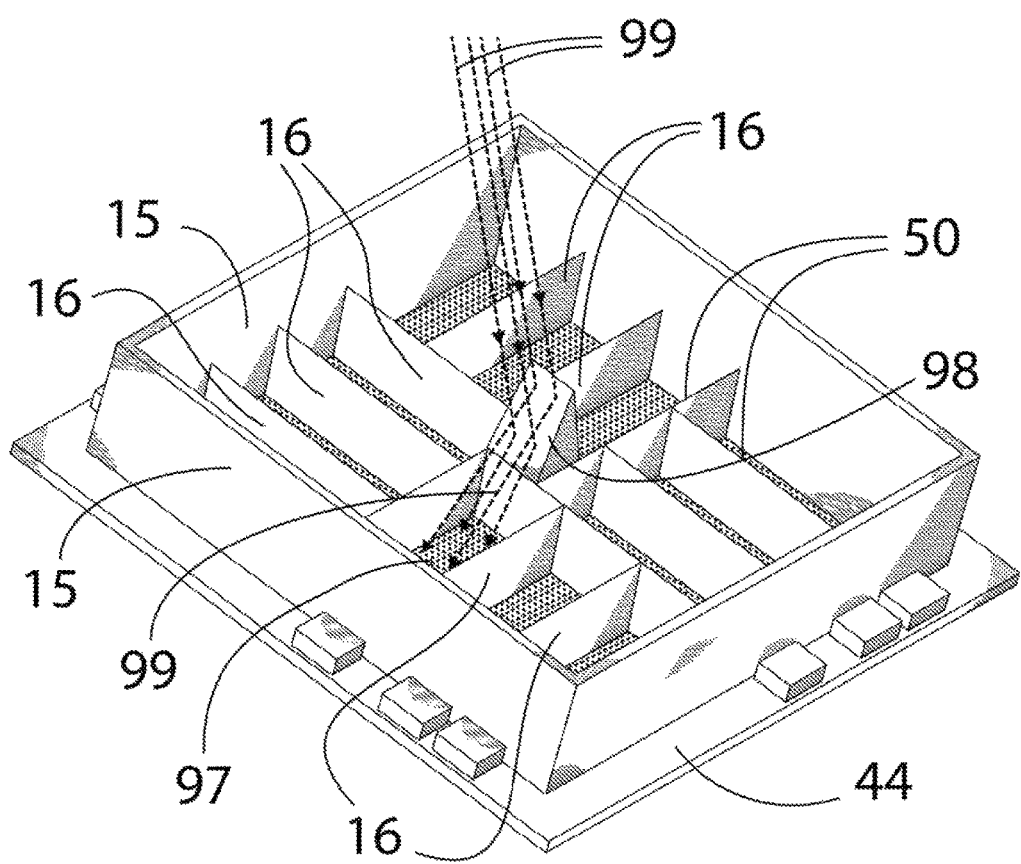
FIG. 11 is a perspective view of a photovoltaic cell circuit card and wedge assembly in accordance with a first embodiment showing a central secondary reflector.

FIG. 11 shows structure provided in accordance with a preferred example of the first embodiment in accordance with the example discussed above, for example, in connection with FIG. 10*b*, using the layout depicted in FIG. 7. Referring to FIG. 11, a central reflector 98 is positioned in the central region 88 to compensate for the reduction in the illumination of cell group 97 and the associated shadowing loss. Central reflector 98 directs light rays 99 from a central unshadowed area 95 onto cell group 97 that, in the illustrated example, is obscured by the image of the shadow 96 of the support arm 25. The size 91 of the central square 88 between the cell groups 36 in this preferred example of the first embodiment is chosen such that even after the central obscuration caused by the square outline of the PCU 20, there is still enough light reflected by the central reflector 98 to compensate for the shadowing by the support arm 25. In this preferred example of the first embodiment, the area of 95, which is the part of the central area 88 not blocked by the shadow 94 of the PCU 20, is substantially the same as the area of the shadow 96 of the cantilever arm 25.

Table 1 gives specific dimensions and design details for an especially preferred optimized example of the first embodiment. In this example, the primary dish reflector 2 is a paraboloid with 1.5 m focal length and a 1.6 m square perimeter 92 (projected along the optical axis of the paraboloid). The central obscuration caused by the PCU 20 is a sixteen centimeter diameter square, while the oversized central length 91 is 25.6 cm as projected onto the dish reflector 2.

In the example provided in Table 1, the optical system is designed to illuminate thirty six 10 mm×10 mm square photovoltaic cells 30 configured as twelve groups 36, each group 36 having three cells 30 in parallel, and each group 36 having a total photovoltaic active area 32 of 30 mm×10 mm. The twelve groups are configured as shown in FIG. 9*b*, with 5 mm wide gaps between the photovoltaic active areas 32 of adjacent cell groups 36. Above each such gap is a 5 mm wide and 10 mm high wedge reflector 16, meaning the first wedge surface 51 and the second wedge surface 52 are disposed at an angle from normal equal to 14°. The wedge knife edges 50 are made coincident with the flat image plane 23 of the primary reflector 2. This image is created by a two-element telecentric lens 29 that resides behind the parabolic focus 7 of the dish reflector 2.

In Table 1, the F/# is defined as the ratio of focal length to diagonal of the square dish 2 and the geometric concentration factor of 710 X is taken as the ratio of dish collector area to cell active area.

Figure 12A:
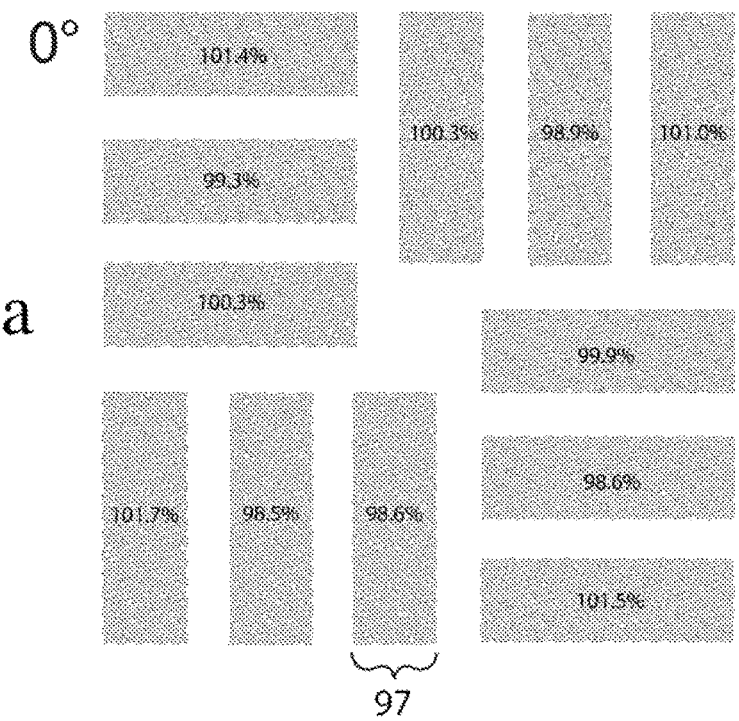
FIG. 12a is a diagram of cell illumination distribution for a first embodiment according to the present invention showing on-axis illumination.
Figure 12B:
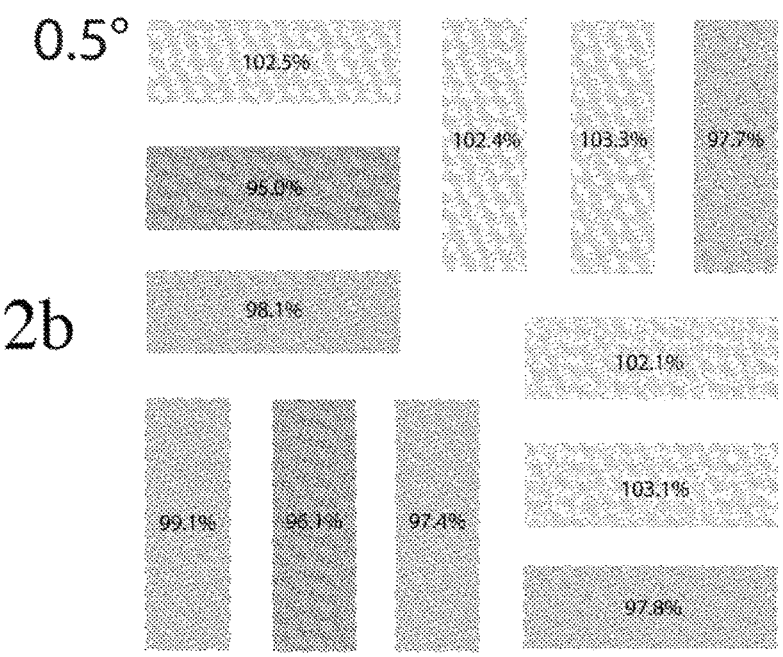
FIG. 12b is a diagram of cell illumination distribution for a first embodiment according to the present invention showing off-axis illumination.
Figure 13A:
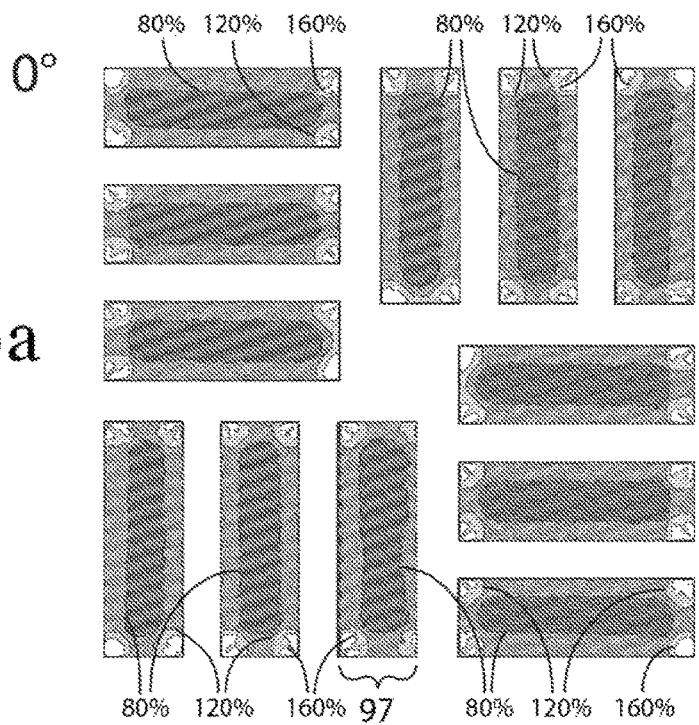
FIG. 13a illustrates irradiation patterns for photovoltaic cell groups corresponding to a first embodiment during on-axis pointing.
Figure 13B:
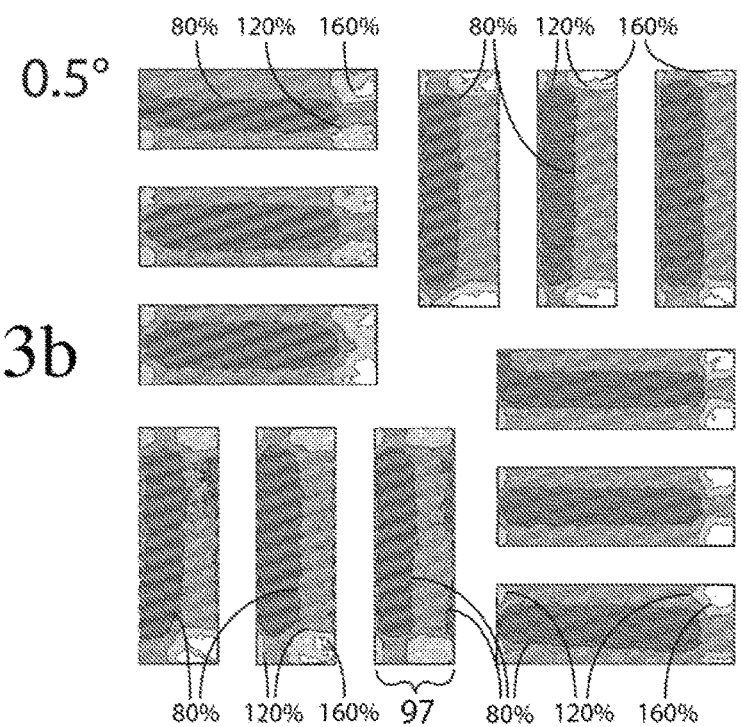
FIG. 13b illustrates irradiation patterns for photovoltaic cell groups corresponding to a first embodiment during off-axis pointing.
Figure 14A:
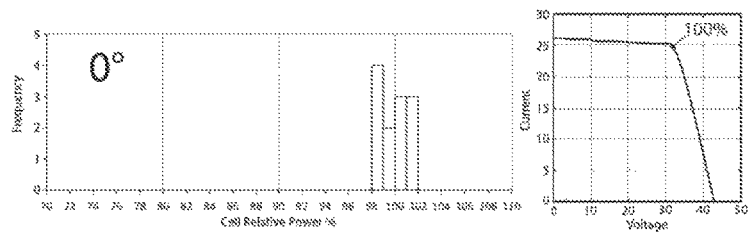
FIG. 14a depicts graphs of a histogram of cell illumination distribution and a current-voltage curve corresponding to on-axis pointing of a first embodiment according to the present invention.
Figure 14B:
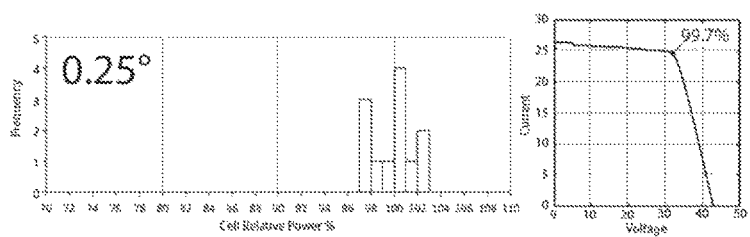
FIG. 14b depicts graphs of a histogram of cell illumination distribution and a current-voltage curve corresponding to off-axis pointing of 0.25 degree for a first embodiment according to the present invention.
Figure 14C:
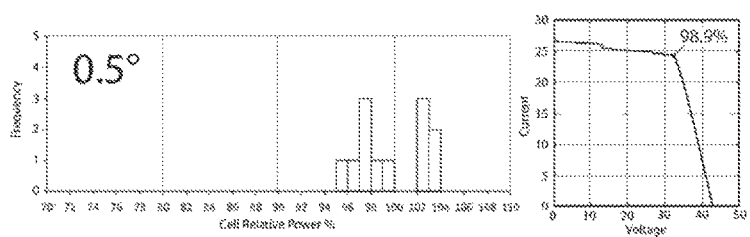
FIG. 14c depicts graphs of a histogram of cell illumination distribution and a current-voltage curve corresponding to off-axis pointing of 0.50 degree for a first embodiment according to the present invention.
Figure 14D:
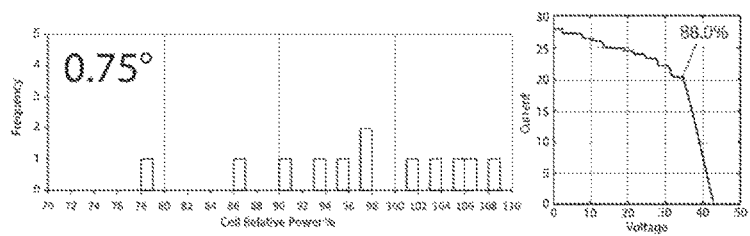
FIG. 14d depicts graphs of a histogram of cell illumination distribution and a current-voltage curve corresponding to off-axis pointing of 0.75 degree for a first embodiment according to the present invention.
Figure 15:
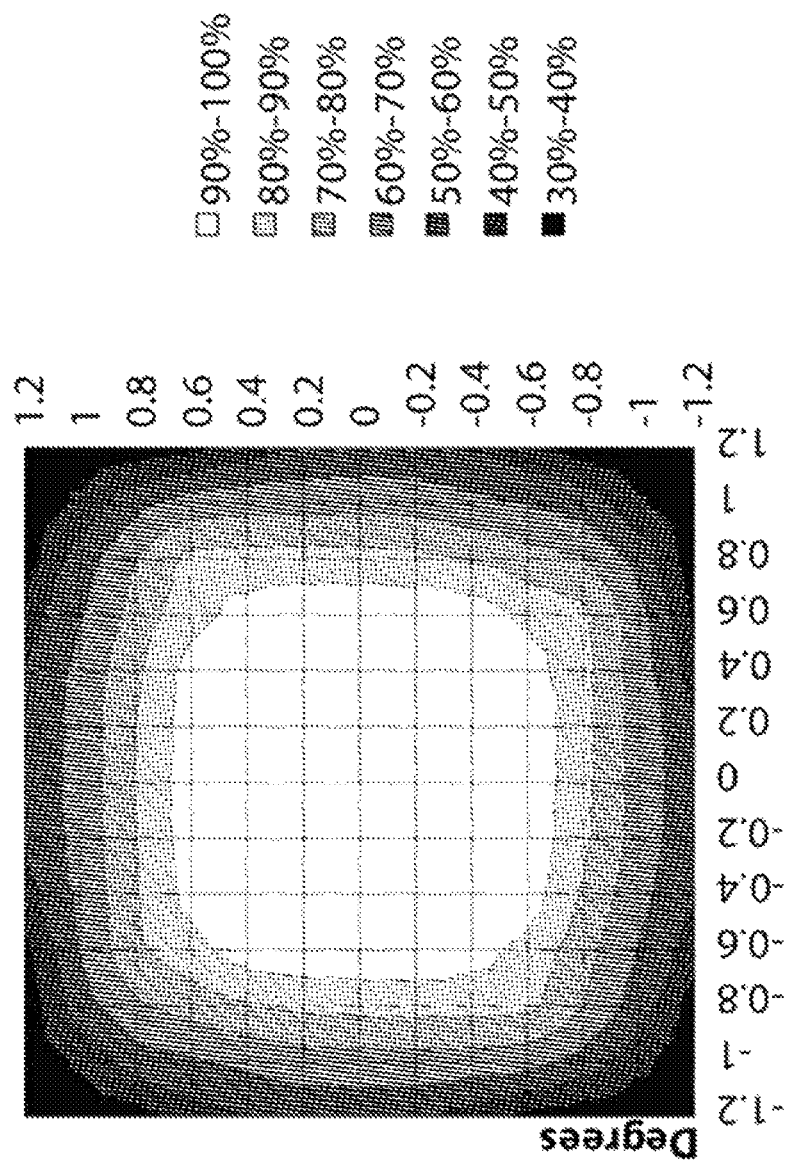
FIG. 15 is a contour diagram of output power as a function of system pointing error for a first embodiment according to the present invention.
Figure 16:
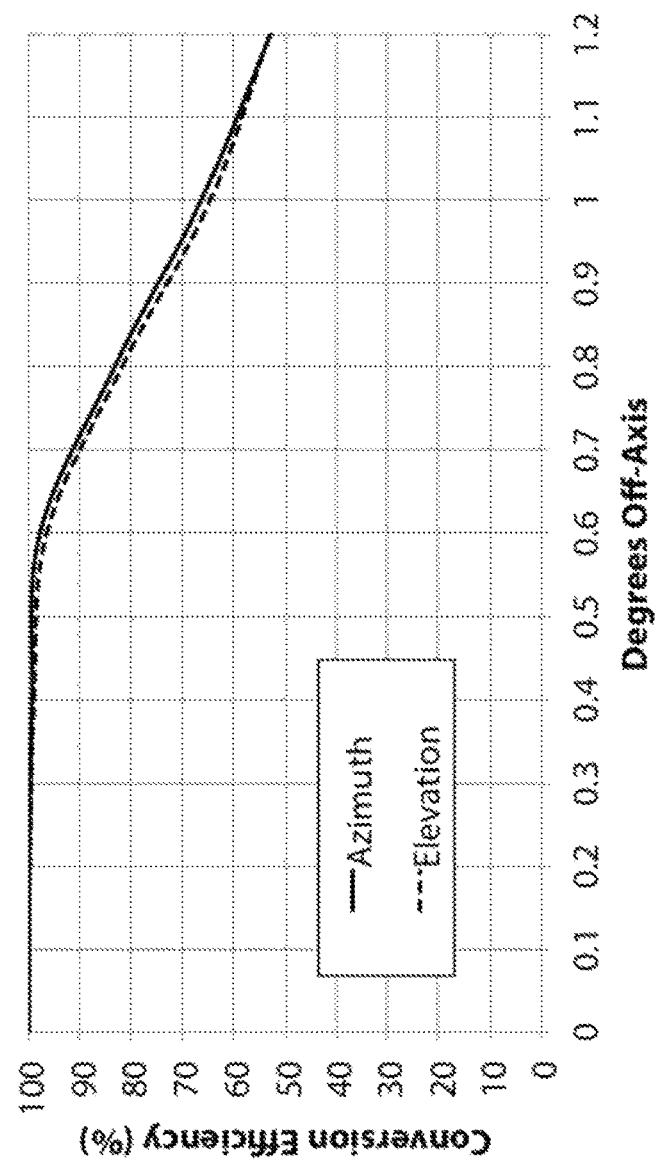
FIG. 16 is a graph depicting output power as a function of azimuth and elevation pointing errors for a first embodiment according to the present invention.

Using on the parameters of Table 1, FIG. 12*a* and FIG. 13*a* give the results of illumination performance calculations for this especially preferred optimized example of the first embodiment, based upon on-axis solar illumination, and FIG. 12*b* and FIG. 13*b* give the results for 0.5° off-axis solar illumination. FIG. 12*a* and FIG. 12*b* show the relative strength of the total optical power received by the different parallel cells groups 36. FIG. 13*a* and FIG. 13*b* show the irradiance pattern on the active cell area 32 of each parallel cell group 36. FIG. 14*a* provides the calculated electrical performance of this especially preferred optimized example in the case of on-axis pointing. The right hand graph shows the computed output curve of current against voltage (IV curve) with the maximum power point indicated, and normalized to 100%. The power contributed to the maximum by each of the 12 cell groups if shown by the histogram on the left. FIG. 14*b*, FIG. 14*c*, and FIG. 14*d* further detail the calculated electrical performance of this especially preferred optimized example as it undergoes mispointing from the sun of 0.25°, 0.5°, and 0.75°, respectively. FIG. 15 shows a contour plot of the maximum power points calculated for system mispointing from the optical axis 19 out to 1.20 in all directions. FIG. 16 deconstructs the contour plot of FIG. 15 into a more detailed view of the maximum power as a function of pointing error in the azimuth and elevation directions. The modeled system is based on the parameters of Table 1 and includes compensation for central obscuration by a support arm 25 of width 25 mm. The solar illumination is modeled as coming from a disc of uniform brightness and subtending 0.5 degrees diameter.

In this especially preferred optimized example, for on-axis pointing 98.2% of the sunlight rays incident across the full aperture of the reflector 2 reach the photovoltaic cells 30, i.e., 8.2% of the rays are received by each parallel cell group 36. The ray-blocking contributions are 1% by the shadow 94 of the PCU 20 and 0.8% by the shadow 96 of the support arm 25. Additional loss of sunlight power entering the full aperture will arise on passage to the photovoltaically active areas 32 of the cells because of less than perfect reflection by the primary reflector dish 2, and dielectric reflection losses at the six surfaces of the window 6 and two lens elements 9 and 11. Further loss from the slight rounding of the tips 50 of the wedge reflectors 15 of origami optics made by the method described herein is estimated to be 2%. Absorption losses are negligible for fused silica. For a somewhat soiled dish having reflectivity of 90%, and dielectric losses of 1% for each antireflection coated surface, these total additional losses amounts to 18%, and thus the total system loss is 20% for on-axis illumination. If used with cells of 43% conversion efficiency, the system is thus estimated to have end-to-end conversion efficiency of 34%. From FIG. 16, the additional ray loss from mispointing reaches 10% only for mispointing angles of 0.7 degrees, thus total system efficiency will remain above 30% even at 0.7 degrees of mispointing.

Second Embodiment

A second embodiment of the present invention is described below which provides a different implementation of the power conversion unit or PCU 20 having a single lens element 70, and having photovoltaic cells 30 configured in four planar arrays 18.

Figure 17A:
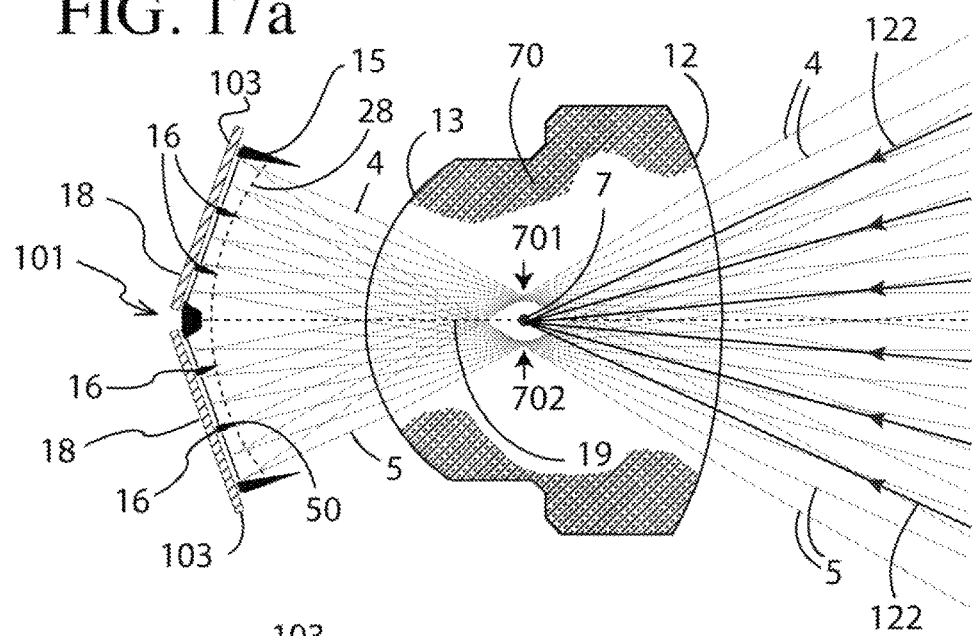
FIG. 17a is a cross-sectional view of a lens design and a plurality of planar photovoltaic cell arrays according to a second embodiment of the present invention.
Figure 37:
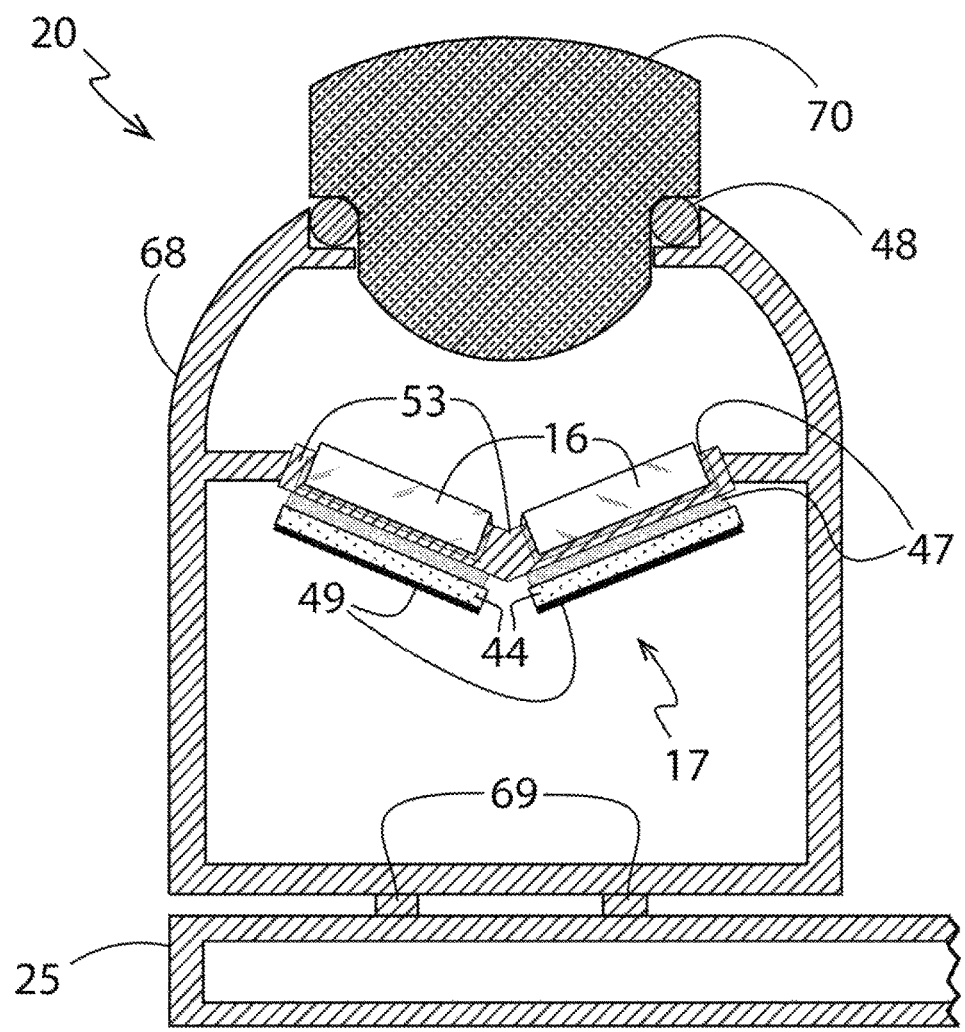
FIG. 37 is a cross-sectional schematic diagram of an example of a Power Conversion Unit.

Turning now to FIG. 17*a*, a second embodiment according to the present invention is shown comprising a PCU 20 having a single lens element 70. Solar rays 22 parallel to the axis 19, after reflection by the dish reflector 2, then converge as rays 122 in the PCU 20. The incoming light rays 122 converge to a focus 7. Additional converging rays 4 and 5 are shown which originate from opposite points on the edge of the sun's disc, and converge to the two corresponding focal points 701 and 702. The foci 7, 701 and 702 are formed within the single lens 70, which also forms the entrance window to the PCU 20 (as shown in FIG. 37).

The lens 70 shown in FIG. 17*a* comprises a single biconvex element with entrance surface 12 and exit surface 13. Rays exiting the surface 13 form a curved image 28 of the primary reflector 2. The image 28 has a substantially square boundary corresponding to the square boundary of the primary reflector 2. Behind the lens 70 is a contiguous arrangement of four cell arrays 18 of photovoltaic cells 30. The four cell arrays 18 are tilted with respect to each other, so as to approximate the concave curved shape of the image 28. Located between the lens 70 and the planar arrays 103 is an array of wedge reflectors 102 composed of interior reflectors 16 and perimeter reflectors 15. The function of the arrays of wedge reflectors 102 is to direct the uniformly distributed rays 4 and 5 emerging from the lens 70 to the photovoltaic cells 30 in the planar arrays 103, and away from gaps between the photovoltaic cells 30. The entire segmented assembly 101 is comprised of the array of wedge reflectors 102 and all four planar arrays 103 of cells 30.

As shown in FIG. 17a, the knife edges 50 of the interior wedges 16 are located closely coincident with the plane of the curved image 28 of the dish reflector 2 formed by the lens 70. In this way, essentially all the light rays 4 and 5 from the primary dish reflector 2 passing through the lens 70 are directed to photovoltaic active areas 32 of the cells 30.

Figure 17B:
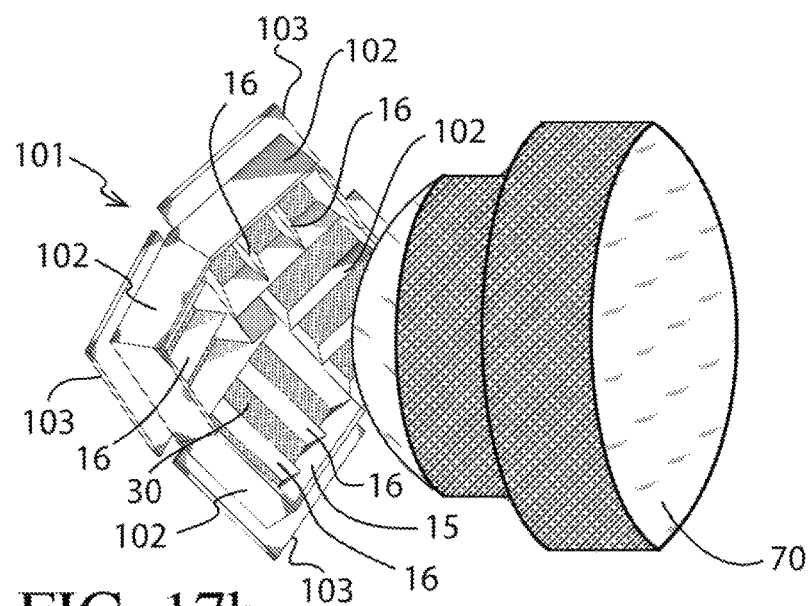

FIG. 17b shows the main elements of the PCU 20 in perspective: the lens element 70, the wedge reflector assembly 102 composed of interior reflectors 16 and perimeter reflectors 15, the planar cell arrays 103, and the extent of the whole segmented assembly 101.

The lens 70 has two characteristics that may be important for the efficient operation of an apparatus according to this second embodiment. First, the boundary of the image formed by the lens 70 is preferably sharp and preferably has approximately the same shape as the primary reflector 2, namely square. This allows high efficiency coupling of the concentrated sunlight to the four square, flat arrays of photovoltaic cells 103.

A second characteristic of the lens 70 that may be important is to deliver light in a direction that is locally approximately perpendicular to the curved image surface 28 and thus approximately perpendicular to the planar cell assemblies 103. This is believed to be an important factor for effective use of wedge reflectors 16.

Figure 18A:
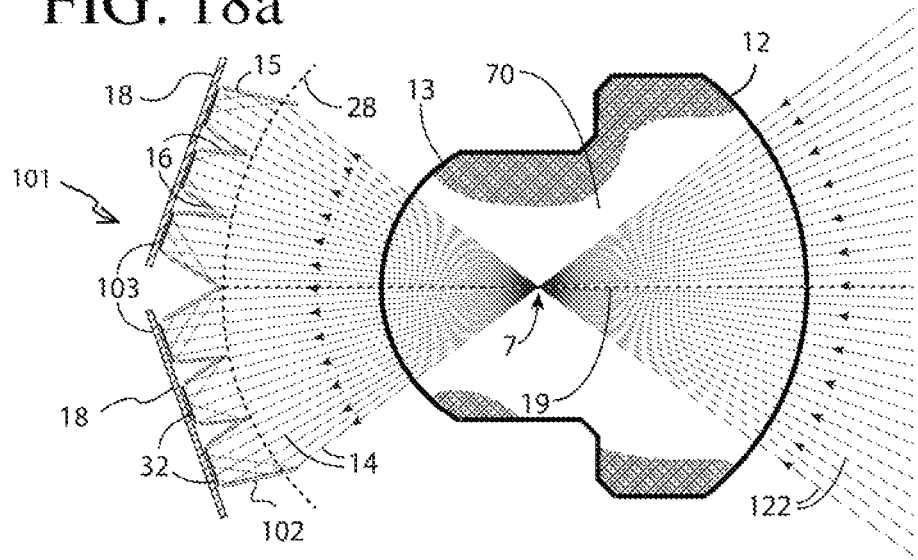
FIG. 18a is a cross-sectional diagram of a second embodiment of the present invention depicting rays of sunlight reflected from a dish reflector during on-axis pointing of the dish reflector.
Figure 18B:
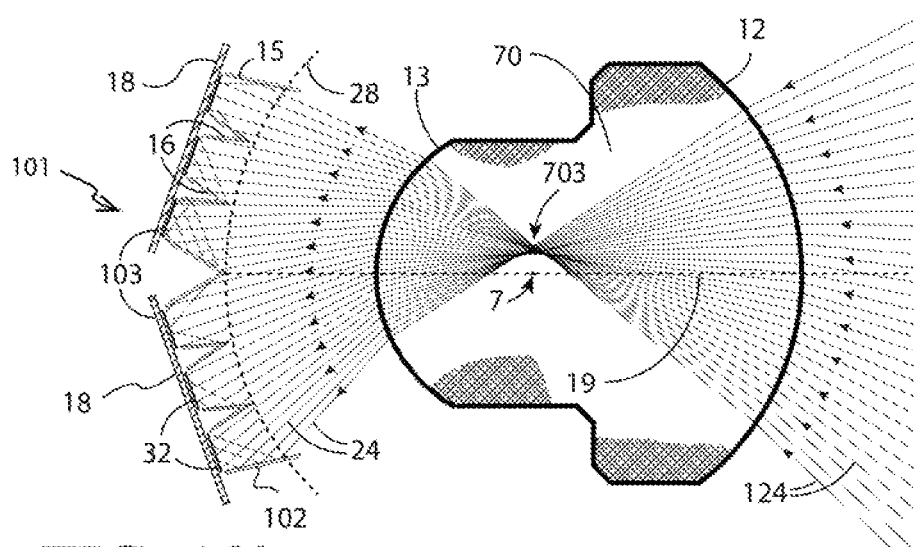
FIG. 18b is a cross-sectional diagram of a second embodiment of the present invention depicting rays of sunlight reflected from a dish reflector during off-axis pointing of the dish reflector.

This is further illustrated in FIG. 18a and FIG. 18b. FIG. 18a shows the incoming on-axis rays 122 after reflection by the primary reflector 2. These rays 122 are brought to a point focus 7. After passage through the lens 70, these refracted rays 14 are locally perpendicular to the image surface 28. FIG. 18b shows rays from a distant point source not aligned with the optical axis 19. In the example shown in FIG. 18b, the off-axis converging rays 124 shown in the drawing are now brought to a focus 703 which is displaced away from the optical axis 19. But after continued refraction through the lens 70, the rays 24 strike the wedge reflector assemblies 102 substantially close to the same region as before (this is a property of an image formed by the lens 70). The angle at which these rays 24 locally strike the curved image surface 28 is displaced away from normal incidence, by an amount that depends on the degree of mispointing of the reflector 2 and associated PCU 20 from the distant source. The rays 24 are thus either substantially perpendicular locally to the image surface 28 or with only a limited range of ray angles away from perpendicular, determined by the degree of mispointing. In this second embodiment, the four planar arrays of cells 103 are configured with their centers substantially parallel to the local image surface 28, and perpendicular to incoming on-axis refracted rays 14. Using this configuration, it is possible to use quadrants 102 of interior wedge reflectors 16 and perimeter reflectors 15 to direct light away from the gaps and the light insensitive areas on the photovoltaic cells 30 and onto the light sensitive areas 32 of the photovoltaic cells 30.

Figure 19A:
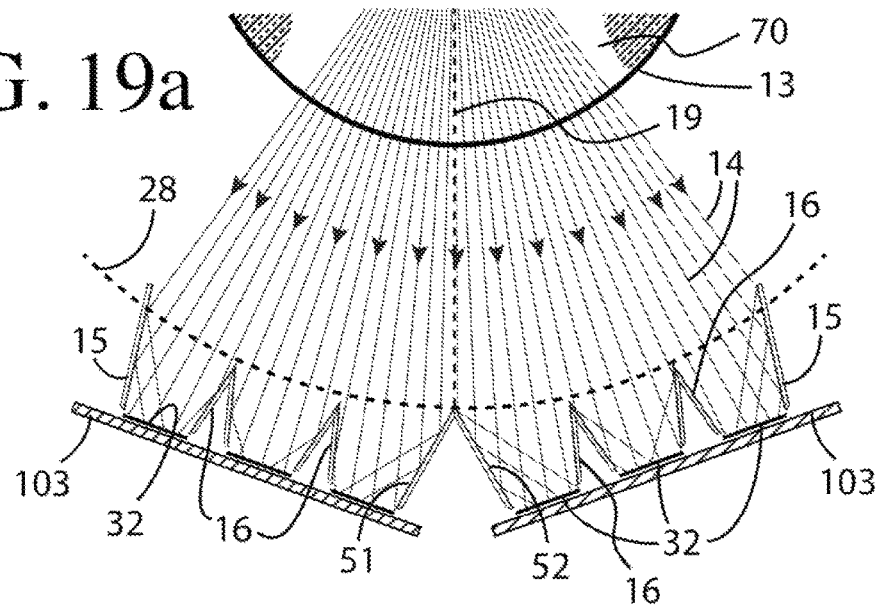
FIG. 19a is a cross-sectional view of a wedge assembly and photovoltaic cells according to a second embodiment of the present invention showing rays of sunlight during on-axis pointing of a dish reflector.
Figure 19B:
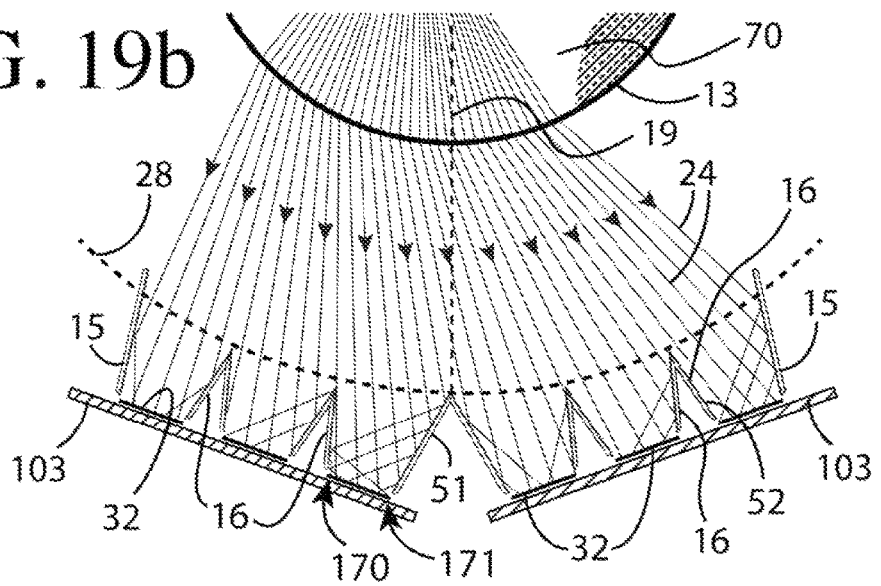
FIG. 19b is a cross-sectional view of a wedge assembly and photovoltaic cells according to a second embodiment of the present invention showing rays of sunlight during off-axis pointing of a dish reflector.

FIG. 19a illustrates the action of interior wedge reflectors 16 and perimeter wedge reflectors 15 under the illumination from the lens 70 for the case of light entering the apparatus on axis. FIG. 19b illustrates the action of interior wedge reflectors 16 and perimeter wedge reflectors 15 under the illumination from the lens 70 for the case of light entering the apparatus off-axis. In FIG. 19a the on-axis rays 14 exiting the rear surface 13 of the lens 70 and striking the first planar reflective side surfaces 51 and the second planar reflective side surfaces 52 of the interior wedge reflectors 16 and perimeter wedge reflectors 15 are reflected to the active areas 32 of the solar cells 30, brightening the illumination along the sides of these areas 32. In FIG. 19b, the off-axis rays 24 exiting the rear surface 13 of the lens 70 are tilted off-perpendicular and generally strike the wedge reflectors 16 primarily on the first planar reflective side surfaces 51, and are reflected further across the active areas 32 of the photovoltaic cells 30, brightening the illumination across most or all of the cell area 32. FIG. 19b illustrates the value of the lens 70 in controlling the range of angles of the rays 24 to be approximately perpendicular to the cell array quadrants 103. Rays far from normal to the array 103, after reflection by the interior wedge reflectors 16 and perimeter wedge reflectors 15, may not reach the active cell area 32 and thus would not generate electricity.

It will be understood by those with common knowledge of optics that the single element lens 70 illustrated is simply one example illustrative of a singlet lens yielding rays near-normal to the local curved image surface 28. Those skilled in the art, after having the benefit of this disclosure, will appreciate that other lens configurations with these properties are possible without departing from the spirit or scope of the present invention. Similarly, those skilled in the art, after having the benefit of this disclosure, will appreciate that lenses with different focal length designed to accommodate dish reflectors 2 with different focal ratios and dimensions are possible without departing from the spirit or scope of the present invention.

The lens 70 is made preferably of fused quartz, to minimize light loss and heating by absorption of the highly concentrated sunlight. Antireflection coatings are preferably applied to the entrance surface 12 and to the exit surface 13 of the lens 70.

In order to maintain uniform division of concentrated sunlight across a plurality of photovoltaic cells 30, groups 36 of cells 30 may be electrically connected in parallel as discussed in connection with FIG. 8a.

Figure 20A:
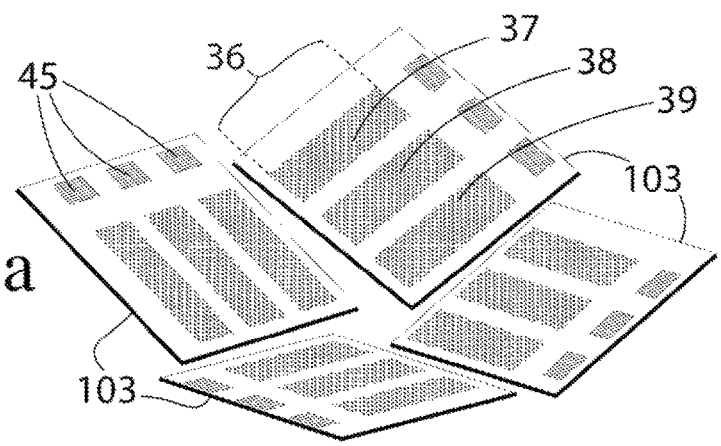
FIG. 20a is a perspective diagram of a plurality of photovoltaic cell circuit cards.

FIG. 20a shows the location of a plurality of cell groups 36 on four flat circuit cards 103. The cards 103 are substantially identical, and correspond to the four identical rectangles 89 of the type illustrated in FIG. 7. Also shown in FIG. 20a are three bypass diodes 45 included on each card 103. Each card 103 with nine photovoltaic cells 30 comprises three cell groups 36, specifically an outer group 37, a middle group 38, and an inner group 39, arranged next to each other as illustrated in FIG. 20a and in FIG. 8b. The three cell groups 36 are connected in series by a printed circuit on each cell card 103. In a PCU 20, the four cards 103 are themselves connected electrically in series. In this highly symmetric arrangement of connecting a total of thirty-six individual photovoltaic cells 30, the objective of achieving balanced photocurrent in a series chain of photovoltaic cells 30 comes down to ensuring that the light is divided evenly between the outer groups 37, the middle groups 38, and the inner groups 39.

Figure 20B:
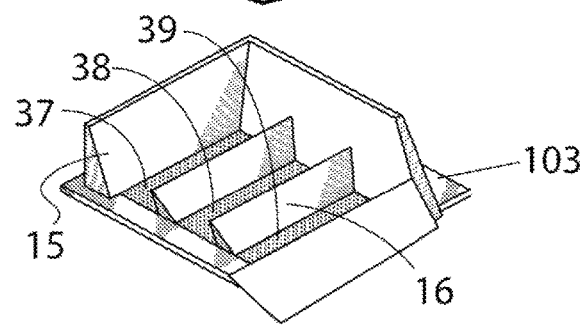
FIG. 20b is a perspective diagram of a photovoltaic cell circuit card and wedge assembly.

FIG. 20b shows a flat cell card 103 configured with interior wedge reflectors 16 located as in FIG. 5, above the light-insensitive areas 31 between the outer cell groups 37, the middle cell groups 38, and the inner cell groups 39. Together with the perimeter sloping reflectors 15 around the perimeter of the cell array 102, the interior wedge reflectors 16 direct the incoming light to the photovoltaically active areas 32 of the three parallel groups 36 of cells 30 on each card 103, specifically the outer cell groups 37, the middle cell groups 38, and the inner cell groups 39.

Figure 20C:
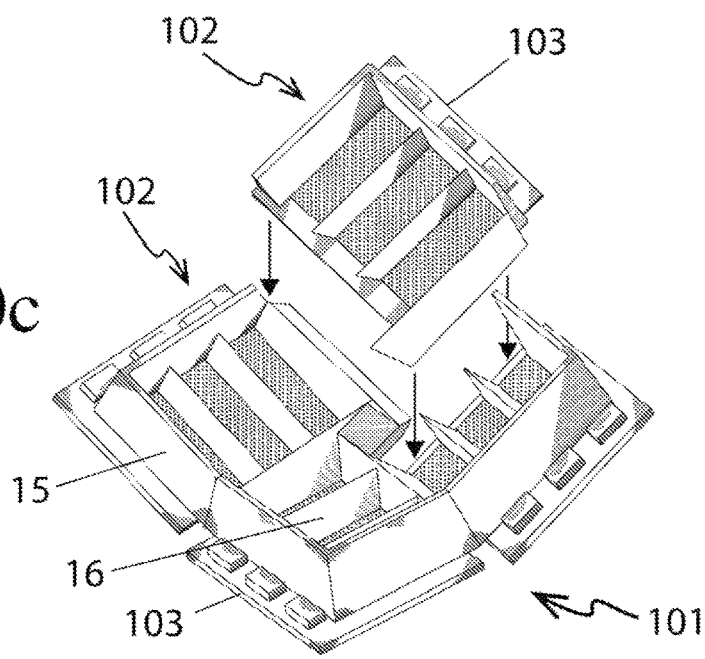
FIG. 20c is a perspective view of a plurality of photovoltaic cell circuit cards and corresponding wedge assemblies according to a second embodiment of the present invention.

FIG. 20c shows an assembly of three such cell cards 103 with reflector quadrants 102, with the fourth card 103 and reflector quadrant 102 being set in place to complete the full segmented assembly 101 of a PCU 20 according to the second embodiment of the invention.

The final optical design of this second embodiment is preferably made by adjustments to the optical parameters, which include the radii of the lens surfaces 12 and 13, their spacing, and positions and the placement and angling of the interior wedge reflectors 16 and the exterior wedge reflectors 15 that comprise each quadrant of wedge arrays 102. In the design process, the lens design is first optimized as an independent unit so as to give a curved, square image 28 of the primary dish reflector 2. In the subsequent system optimization, the merit criterion is changed to be uniform power division between parallel cell groups 36, including the effects of edge reflection to redirect rays onto the active cell areas 32, the uniformity to be maintained for both on-axis and off axis illumination.

As a practical matter, the PCU 20 must be supported above the center of the reflector 2. Entering sunlight rays 22 will thus be blocked to some degree by the support structure for the PCU 20. In the case of a cantilever arm 25, the loss of light will be localized below the arm, and lead to asymmetrical light distribution.

Figure 21A:
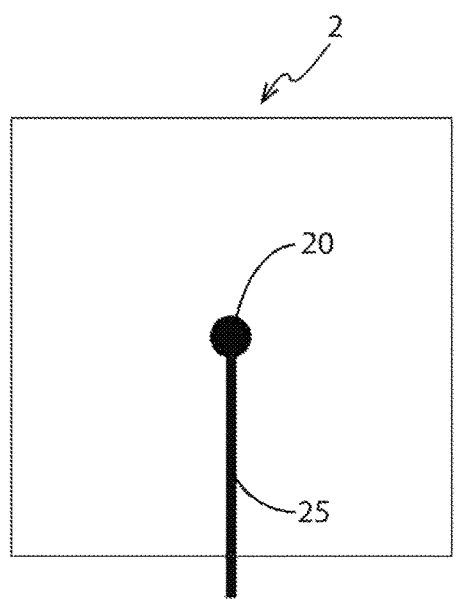
FIG. 21a is a plan view of a dish reflector and cantilever arm supporting a Power Conversion Unit in accordance with a second embodiment of the present invention.
Figure 21B:
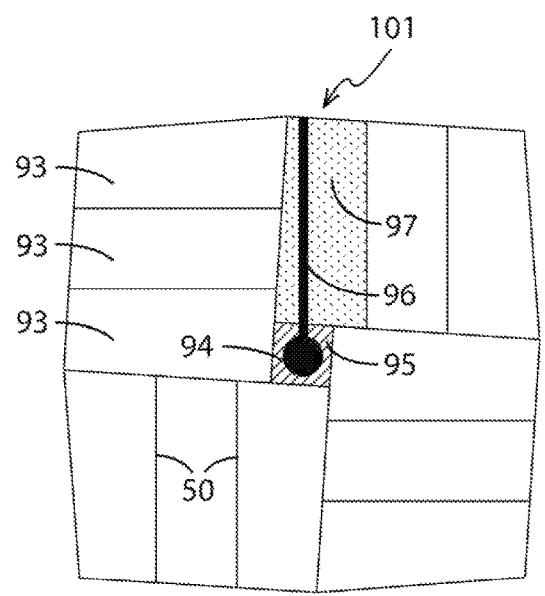

In accordance with a second embodiment of the present invention, FIG. 21a is a view down the system axis 19 of a primary square reflector 2 obscured in part by a PCU 20 and PCU support arm 25. In this embodiment, the PCU 20 outline is circular, as shown in FIG. 21a. FIG. 21b is a view down the system axis of the wedge/cell assembly 101 within the PCU 20, showing the image formed by the lens 70 of the PCU 20 and PCU support arm 25 in relation to the wedge knife edges 50 which define the areas of light within the image plane 28 that are reflected to the different cell groups 36. This shows the region of obscuration—the image of the support arm 25 appears as a dark bar 96, causing a reduction in the illumination of the cell group 36 located in area 97.

Figure 22:
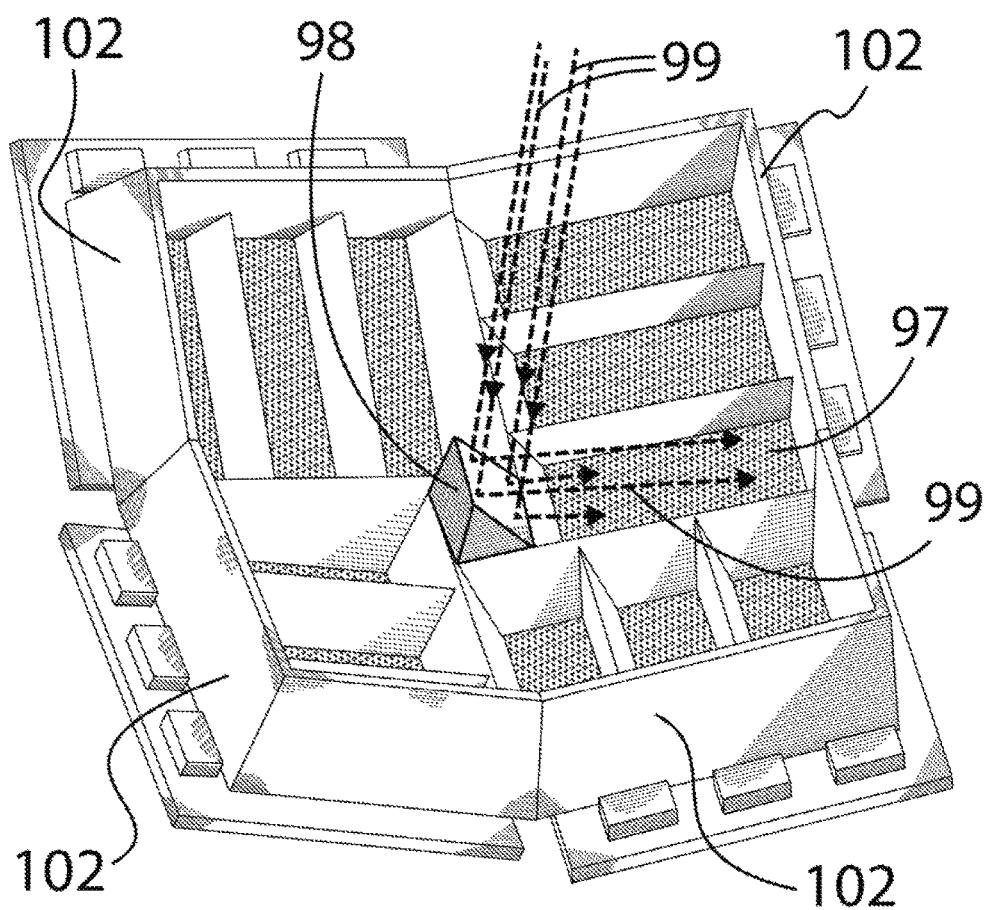
FIG. 22 is a perspective view of a photovoltaic cell circuit card and wedge assembly in accordance with a second embodiment showing a central secondary reflector.

FIG. 22 shows a preferred method to compensate for this shadowing loss. A central reflector 98 is positioned to direct rays 99 from central un-shadowed area 95 onto cell group 97 that is obscured by the image of the shadow of the cantilever arm 96. The size of the central square 91 between the wedge reflectors 16 in this particular embodiment is chosen such that even after the central obscuration 94 caused by the PCU 20, there is still enough light 99 reflected by the central reflector 98 to compensate for the shadowing of cell group 97 by the support arm 25. The area of 95, the part of the central area not blocked by the PCU's shadow, is substantially the same as the area 96 of the image of the shadow of the cantilever arm.

Table 2 gives the prescription of a preferred example of the second embodiment providing an optimized lens prescription and placement, as shown in FIG. 17 and FIG. 18. It has the appropriate optical power, size, and location so as to bring focused light to a curved, suitably sized image 28 of the primary reflector 2 that matches the area of the chosen cell groups 36 and wedge array 102 dimensions. It will be understood that this design is simply an illustrative example, and that other designs with different dimensions, numbers of cells and cell groupings will fall within the scope of this invention.

In this preferred example of the second embodiment, the primary dish reflector 2 is a paraboloid with 1.5 m focal length and a 1.6 m square perimeter 92 (projected along the optical axis of the paraboloid). The central obscuration caused by the PCU 20 is a 15.2 cm diameter circle, while the oversized central length 91 being 19.6 cm as projected onto the dish reflector 2.

The optical system is designed to illuminate a total of thirty-six 8.8 mm×8.8 mm square photovoltaic cells 30 configured as three groups 36 on each of four planar cards 103. Each group 36 having three cells 30 in parallel, and each group 36 having a total photovoltaic active area 32 of approximately 26.4×8.8 mm. The three groups on each planar card 103 are configured as shown in FIG. 20, with 3 mm wide gaps between the photovoltaic active areas 32 of adjacent cell groups 36.

Above each gap is a 4.2 mm wide and 9 mm high wedge reflector 16, with the wedge surfaces 51 and 52 having an angle from normal averaging approximately 13°. The wedge knife edges 50 are made substantially coincident with the curved image plane 28 of the primary dish reflector 2. This image 28 is created by a lens 70. The parabolic focus 7 of the dish reflector 2 falls within the lens 70.

In Table 2, the F/# is defined as the ratio of focal length to diagonal of the square dish 2 and the geometric concentration factor of 918 X is taken as the ratio of total dish collector area to total cell active area.

Figure 24A:
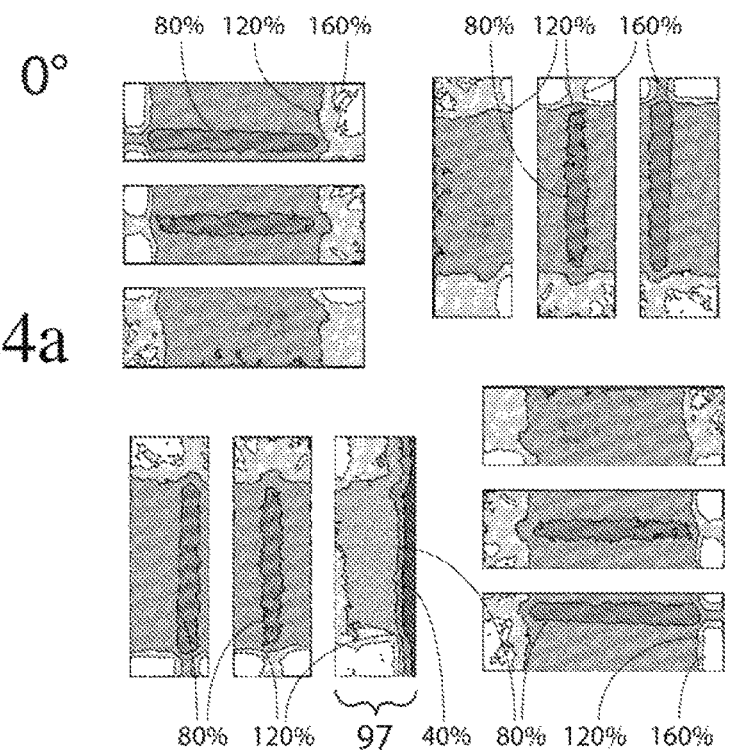
FIG. 24a illustrates irradiation patterns for photovoltaic cell groups corresponding to a second embodiment during on-axis pointing.
Figure 24B:
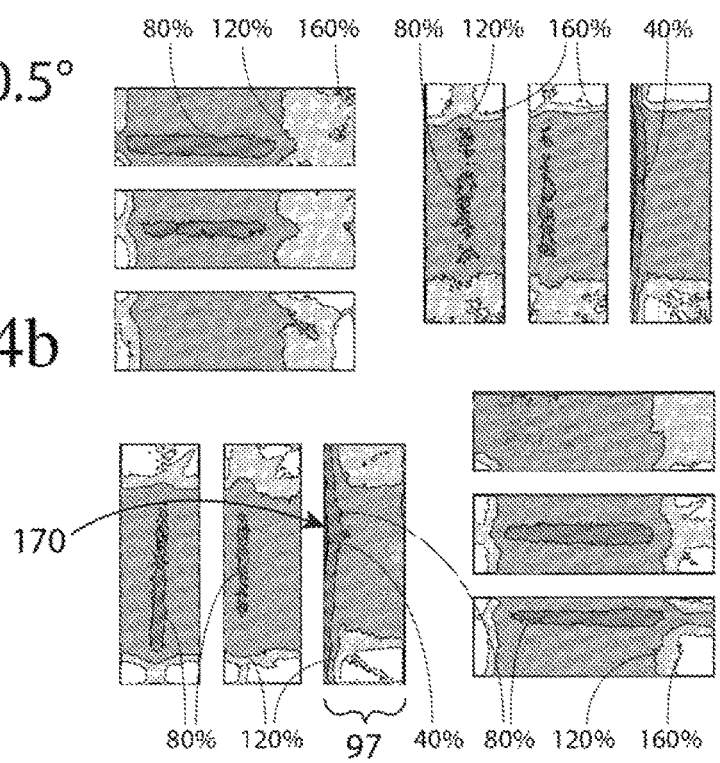
FIG. 24b illustrates irradiation patterns for photovoltaic cell groups corresponding to a second embodiment during off-axis pointing.
Figure 25A:
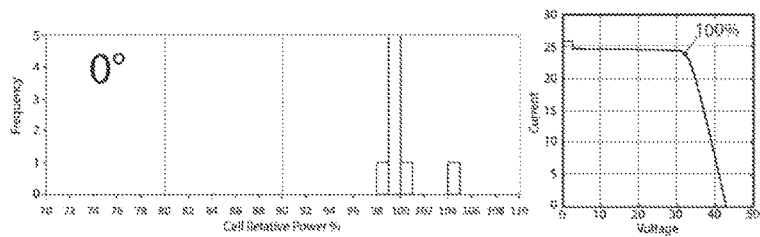
FIG. 25a depicts graphs of a histogram of cell illumination distribution and a current-voltage curve corresponding to on-axis pointing of a second embodiment of the present invention.
Figure 25B:
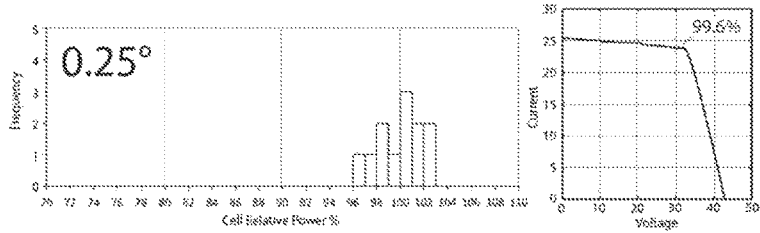
FIG. 25b depicts graphs of a histogram of cell illumination distribution and a current-voltage curve corresponding to off-axis pointing of 0.25 degree for a second embodiment of the present invention.
Figure 25C:
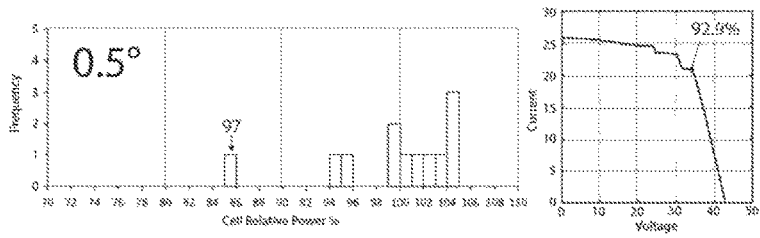
FIG. 25c depicts graphs of a histogram of cell illumination distribution and a current-voltage curve corresponding to off-axis pointing of 0.50 degree for a second embodiment of the present invention.
Figure 25D:
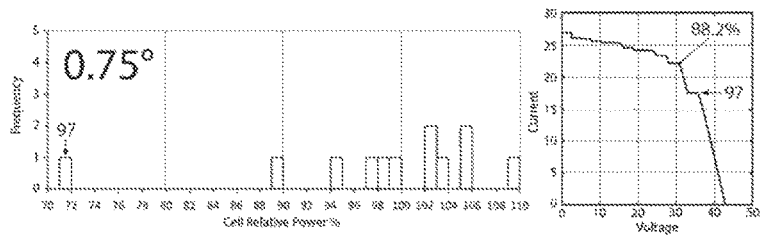
FIG. 25d depicts graphs of a histogram of cell illumination distribution and a current-voltage curve corresponding to off-axis pointing of 0.75 degree for a second embodiment of the present invention.
Figure 26:
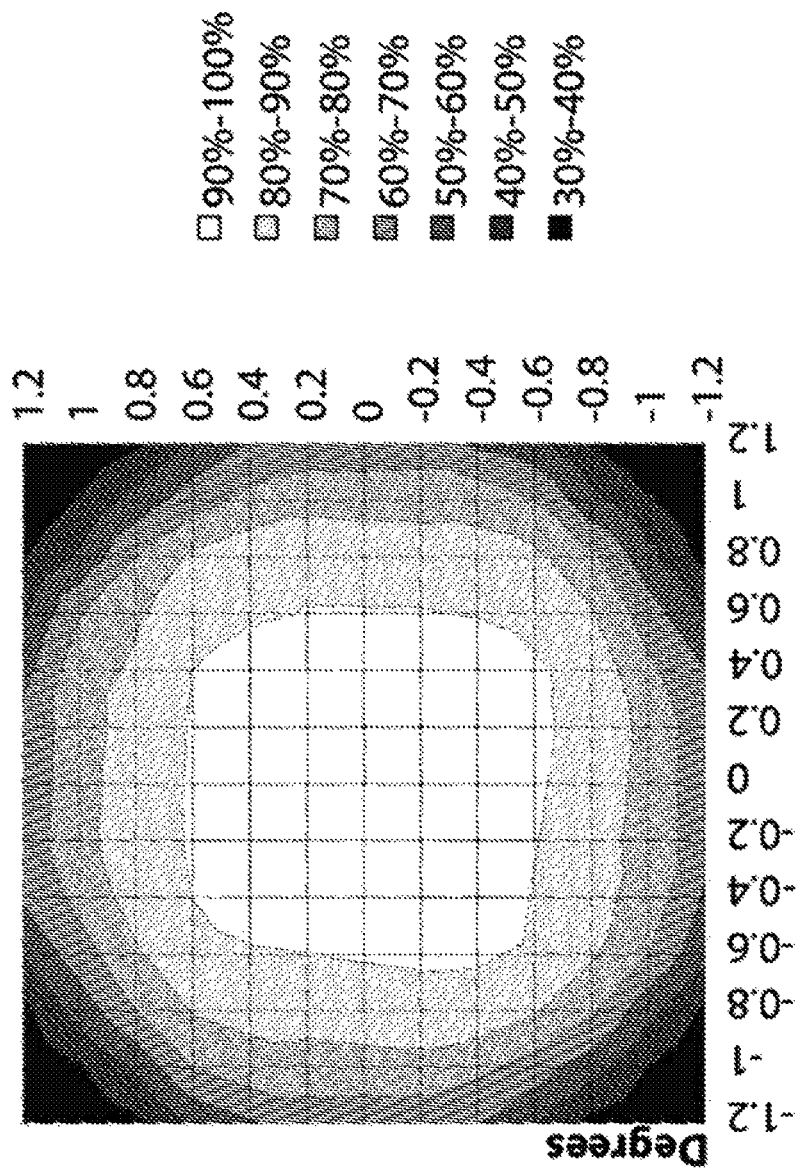
FIG. 26 is a contour diagram of output power as a function of system pointing error for a second embodiment according to the present invention.

Using on the parameters of Table 2, FIG. 23a and FIG. 24a give the results of illumination performance calculations for this especially preferred optimized example of the second embodiment, based upon on-axis solar illumination, and FIG. 23b and FIG. 24b give the results for 0.5° off-axis solar illumination. FIG. 23a and FIG. 23b show the relative strength of the total optical power received by the different parallel cells groups 36. FIG. 24a and FIG. 24b show the irradiance pattern on the active cell area 32 of each parallel cell group 36. FIG. 25a provides the calculated electrical performance of this especially preferred optimized example in the case of on-axis pointing. The right hand graph shows the computed output curve of current against voltage (IV curve) with the maximum power point indicated, and normalized to 100%. The power contributed to the maximum by each of the twelve cell groups is shown by the histogram on the left. FIG. 25b, FIG. 25c, and FIG. 25d further detail the calculated electrical performance of this especially preferred optimized example as it undergoes mispointing from the sun of 0.25°, 0.5°, and 0.75°, respectively. FIG. 26 shows a contour plot of the maximum power points calculated for system mispointing from the optical axis 19 out to 1.2° in all directions.

Figure 27:
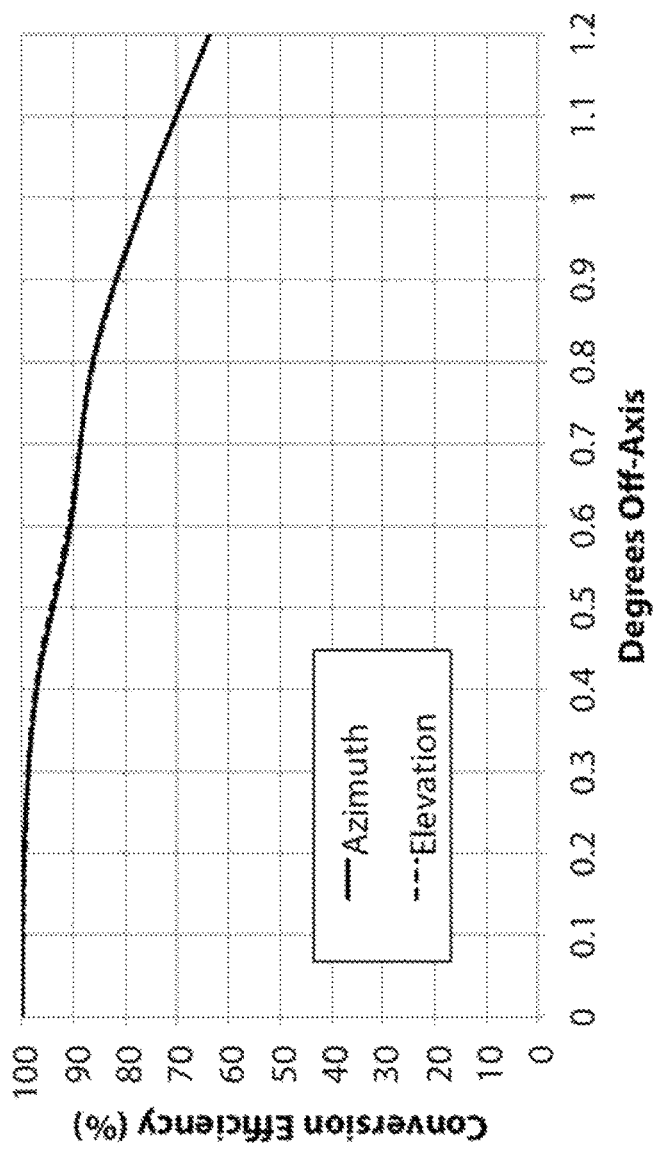
FIG. 27 is a graph depicting output power as a function of azimuth and elevation pointing errors for a second embodiment of the present invention.

FIG. 27 deconstructs the contour plot of FIG. 26 into a more detailed view of the maximum power as a function of pointing error in the azimuth and elevation directions. The modeled system is based on the parameters of Table 2 and includes compensation for central obscuration by a support arm 25 of width 25 mm. The solar illumination is modeled as coming from a disc of uniform brightness and subtending 0.5 degrees diameter.

In this especially preferred optimized example, for on-axis pointing 98.2% of the sunlight rays incident across the full aperture of the reflector 2 reach the photovoltaic cells 30, i.e., 8.2% of the rays are received by each parallel cell group 36. The ray-blocking contributions are 1% by the shadow 94 of the PCU 20 and 0.8% by the shadow 96 of the support arm 25. Additional loss of sunlight power entering the full aperture will arise on passage to the photovoltaically active areas 32 of the cells because of less than perfect reflection by the primary reflector dish 2, and dielectric reflection losses at the two surfaces lens 70. Further loss from the slight rounding of the tips 50 of the wedge reflectors 15 for origami optics made by the method described herein is estimated to be 2%. Absorption losses are negligible for fused silica. For a somewhat soiled dish having reflectivity of 90%, and dielectric losses of 1% for each antireflection coated surface, these total additional losses amounts to 14%, and thus the total system loss is 16% for on-axis illumination. If used with cells of 43% conversion efficiency, the system is thus estimated to have end-to-end conversion efficiency of 36%. From FIG. 16, the additional ray loss from mispointing reaches 12% only for mispointing angles of 0.7 degrees, thus total system efficiency will remain above 31% even at 0.7 degrees of mispointing.

Method of Manufacturing

Figure 38:
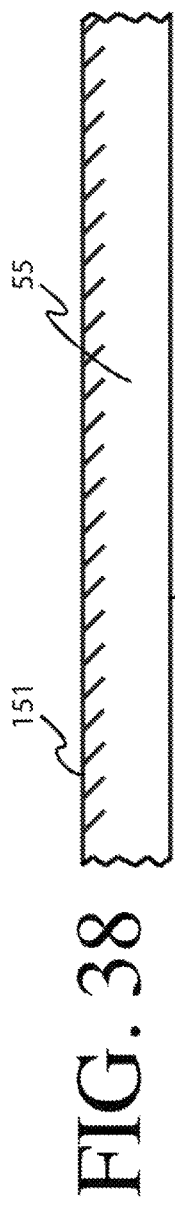
FIG. 38 is a diagram of a flat sheet of pre-coated reflective material used to make wedge reflectors 16.
Figure 39:
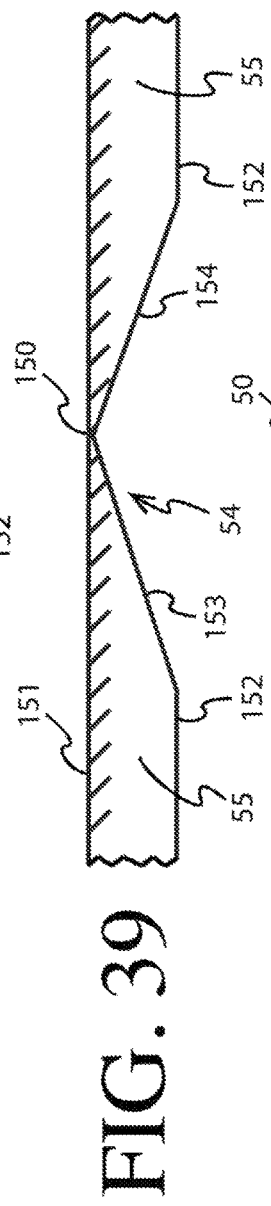
FIG. 39 is a diagram of the reflective material shown in FIG. 38 after an undercut is made in the sheet.
Figure 40:
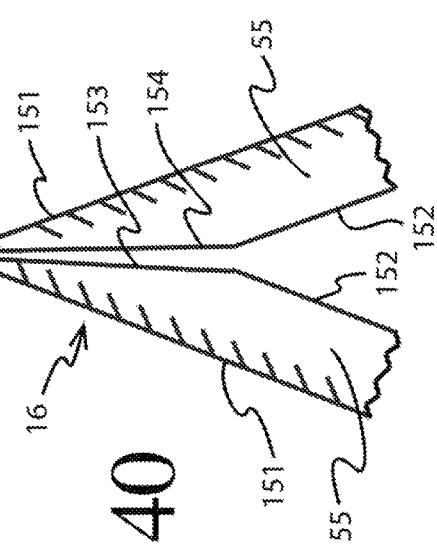
FIG. 40 is a diagram of the reflective material shown in FIG. 39 after the material is folded to form a wedge reflector.

FIG. 38, FIG. 39, and FIG. 40 illustrate various steps of a method of manufacturing origami optics having a wedge reflector 16 with sharp edges from flat sheets of reflective material 55. A preferred reflective material 55 is thin aluminum, polished to high specularity and coated with silver 151. A protective layer over the reflective coating 151 may also be provided. Such material is commercially manufactured in large areas with very high and stable reflectivity. Multiple dielectric layers may be used to enhance reflectivity and stability without significantly increasing manufacturing costs, because manufacturing methods for coating very large flat sheets at high speed are well developed.

FIG. 38 shows in a detail a cross-section of a sheet of material 55, such as pre-coated aluminum, having a reflective surface 151. FIG. 39 shows the sheet 55 after undercutting a groove 54 in the bottom side 152 of the sheet 55. The groove 54 has a first groove side 153 that forms a shallow angle to the reflective surface 151, and a second groove side 154 that similarly forms a shallow angle to the reflective surface 151. The groove 54 has a sharpness and depth so as to nearly part the sheet 55, leaving a very narrow, thin joining region 150.

FIG. 40 shows the sharp edge 50 formed in the wedge reflector 16 by folding the sheet 55 by bringing the first groove side 153 into close proximity with the second groove side 154. Referring to FIG. 39, the sheet 55 shown in FIG. 39 is folded down along the thin joining region 150 in order to arrive at the wedge reflector 16 shown in FIG. 40.

While FIG. 38, FIG. 39, and FIG. 40 show detailed steps of how a sheet 55 of pre-coated aluminum is folded to make a single wedge reflector with a sharp knife edge 50, the present invention includes a method of conveniently manufacturing an assembly of interior wedge reflectors 16 and perimeter inward sloping reflectors 15 from reflector sheets 55 by cutting the sheet 55 with multiple grooves 54, so that each grove 54 may be folded to form a plurality of both perimeter reflectors 15 and wedge reflectors 16 from one sheet 55, with the correct geometry incorporated into the pattern of grooves that are cut into the sheet 55. For purposes of the present invention, "origami optics" is defined as a configuration of a plurality of wedge reflectors 16 and perimeter reflectors 15 made from a sheet 55 of reflective material by cutting a pattern of grooves in the sheet 55 and folding the sheet in accordance with the pattern of grooves to form the plurality of wedge reflectors 16 and perimeter reflectors 15.

FIGS. 28*a* through 28*j* illustrate steps in the manufacture of an assembly designed for use with cells in identical quadrants, each quadrant having three elongated cell groups. It will be apparent to those familiar with the art that the method could be applied to configurations with differently shaped groups and different numbers of groups.

FIG. 28*a* shows one of four identical folded reflectors which, when fitted together, will form a complete reflector wedge assembly 102. The assembly in FIG. 28*a* incorporates seven of the eight planar surfaces that reflect light to one quadrant, and one of the eight surfaces that reflect light to the next quadrant—reflector surface 59. This configuration is chosen so that the knife edge 50 that splits light between adjacent quadrants is made by a fold in one piece of reflector material, and does not require the difficult butting of separate pieces to form a knife edge. The three cutouts that form assembly 102 are two interior reflector cutouts 71 and a perimeter reflector cutout 72. FIG. 28*b*, shows the underside of a rectangle 55 of pre-coated reflective material with the outlines 71 and 72 of cut-outs which will be folded to become an interior reflector 16 and perimeter reflector 15. Undercuts 54, shown also in FIG. 5, and perimeter wedge notches 73, are milled away from the sheet 55 prior to cutting out each reflector.

To create an interior reflector 16, the outline 71 shown is cut from the reflective sheet 55, as shown in FIG. 28*c*, and is bent around the central undercut 54 edge, as shown in FIG. 28*d*. This creates a single interior wedge reflector 16, as shown in FIG. 28*e*, with a knife-edge 50, and a first planar reflective side 51 and a second planar reflective side 52. The undercuts 54 are made so as to almost cut through the material, so that folding yields a sharp knife-edge 50 on the reflective side 151. To create the perimeter reflector 15, the cutout 72 from the sheet 55 shown in FIG. 28*f* has a more complex shape, to yield four linked planar facets 56, 57, 58, and 59 after folding. The perimeter reflector left side 56 is bent away from the undercut edge 54 dividing it from the perimeter reflector right side 57, while the perimeter reflector roof outside 59 is bent around the undercut edge 54 dividing it from the perimeter reflector roof inside 58, as shown in FIG. 28*g*. The perimeter reflector roof comprising 58 and 59 is then bent around the undercut edge 54 dividing it from the perimeter reflector right side 57, as shown in FIG. 28*h*. When rotated around, this three-fold part creates the entire perimeter reflector 15, as shown in FIG. 28*i*. Two interior wedge reflectors 16 and a perimeter wedge reflector 15 are then combined as in FIG. 28*j* to create a complete wedge reflector quadrant 102.

Figure 29A:
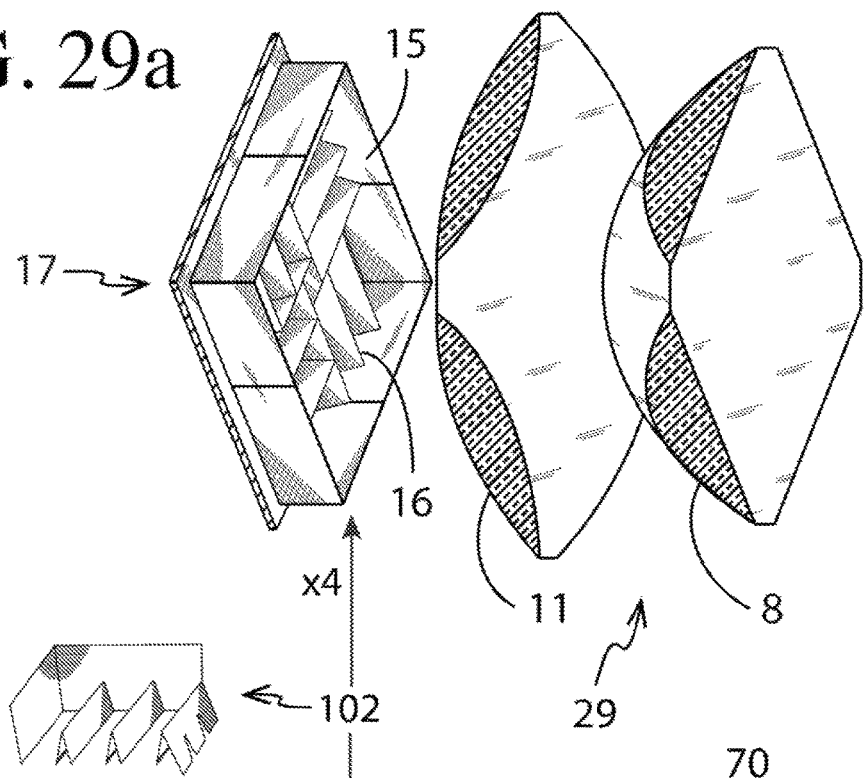
FIG. 29a is a diagram showing the configuration of four quadrants of a wedge reflector assembly according to the first embodiment of the present invention.
Figure 29B:
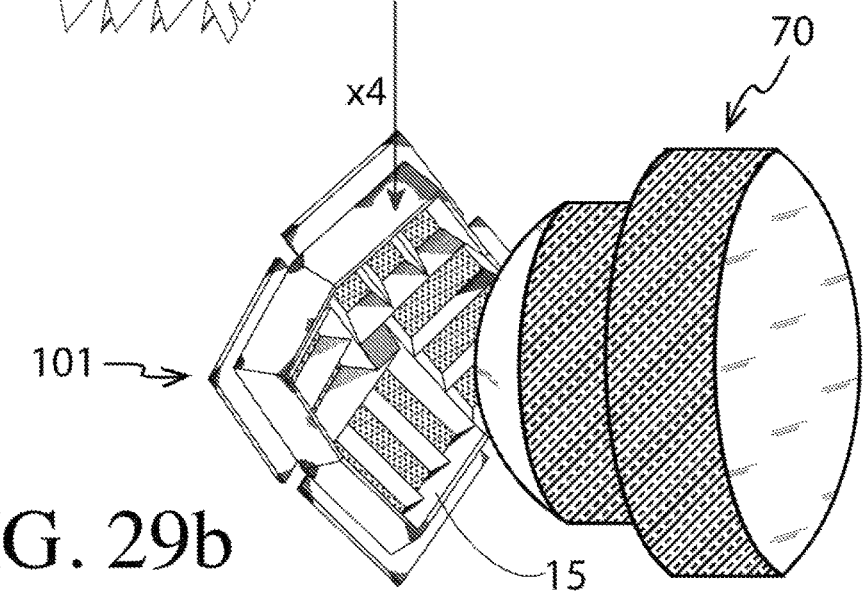
FIG. 29b is a diagram showing the configuration of four quadrants of a wedge reflector assembly according to the second embodiment of the present invention.

FIG. 29*a* details how each wedge reflector quadrant 102 is inserted into the first embodiment, and FIG. 29*b* details how each wedge reflector quadrant 102 is inserted into the second embodiment. In FIG. 29*a*, four of the wedge reflector quadrants 102 are brought together to create the secondary optics of the secondary assembly 17 of the first embodiment. In FIG. 29*b*, four of the wedge reflector quadrants 102 are brought together to create the secondary optics of the complete segmented wedge assembly 101 of the second embodiment. This four-part segmented construction is also shown in FIG. 20*c*.

The electrical and thermal connection for the first embodiment and the second embodiment may be described as follows. Referring to FIG. 5, mechanical support, cooling and partial electrical connection of the complete flat cell array is made by soldering the cell groups 36 and the bypass diodes 45 to a ceramic circuit card 44. The circuit is made through lands 201 and 202 formed by etching gaps in the copper directly bonded to the thermally conductive ceramic 83. The circuit is completed by interconnections made between the cells 30 by wire or ribbon conductors 40 and 41 connected to the cell face negative electrodes 31 shown in FIG. 4. It will be understood by those skilled in the art of electrical circuitry that the bonds 40 and 41 could be wire or ribbon or welded foil. Within each parallel cell group 36, the common connection of the three cell base positive electrodes 35 is made by their all being soldered to the same continuous copper land 203, so they are all at the same electric potential.

Figure 30:
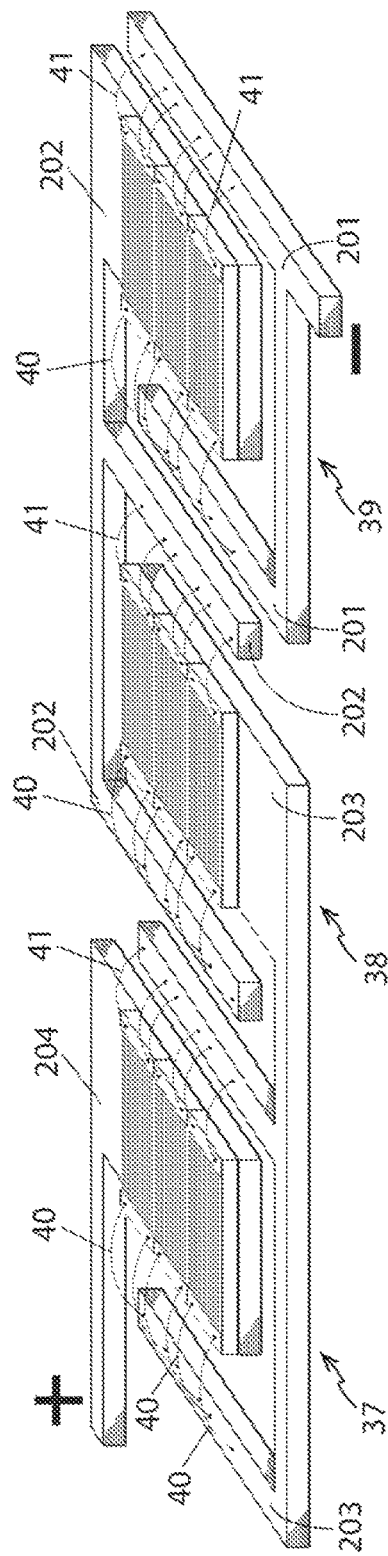
FIG. 30 is a perspective view of photovoltaic cell groups of three cells, where the groups are connected in series on a circuit card.

A method of linking the three common front electrodes and of making the series connection between the adjacent groups is shown in FIG. 30, for a series chain of a first parallel group of three photovoltaic cells 37, a second parallel group of three photovoltaic cells 38, and a third parallel group of three photovoltaic cells 39.

The circuit card is etched to form four discrete continuous lands 201, 202, 203 and 204, that are interdigitated between each other in the plane of the card. Wirebonds 40 from the left hand top electrodes of the first parallel group of cells 37 link to a strip of land that is part of the U-shaped land 203. Wirebonds 41 from the right hand top electrodes of the first parallel group of cells 37 link to a strip of land this is also part of the U-shaped land 203. These strips of land 203 are then connected to the base electrodes 35 of the second parallel group of cells 38 completing the series connection of the first group 37 and the second group 38. Similarly wirebonds 40 from the left hand top electrodes of the second parallel group of cells 38 link to a strip of land that is part of the U-shaped land 202 that underlies the third parallel group of cells 39. Wirebonds 41 from the right hand top electrodes of the second parallel group of cells 38 link to a strip of land that is part of the U-shaped land 202, completing the series connection of the second parallel group of cells 38 and the third parallel group of cells 39.

Figure 31:
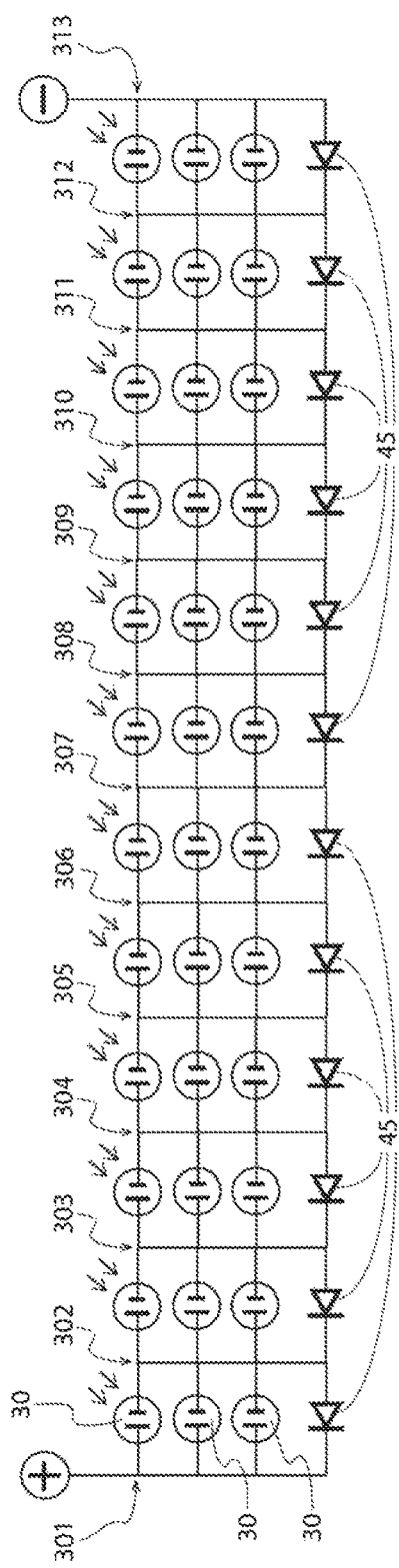
FIG. 31 is a schematic diagram of the electrical connections for a plurality of photovoltaic cells connected in parallel groups of three cells each with a bypass diode, where the groups of cells are connected in series.

In a preferred implementation, the electrical circuit linking all twelve cell groups in a PCU 20 is shown schematically in FIG. 31. There are three cells 30 in each parallel group 36. Each parallel group 36 includes a bypass diode 45. Twelve parallel groups are connected electrically in series in the example shown in FIG. 31. The electrical potentials at each node are numbered as shown in FIG. 31, starting at 301, the negative output terminal, and numbered sequentially to 313 for the positive output terminal.

Figure 32:
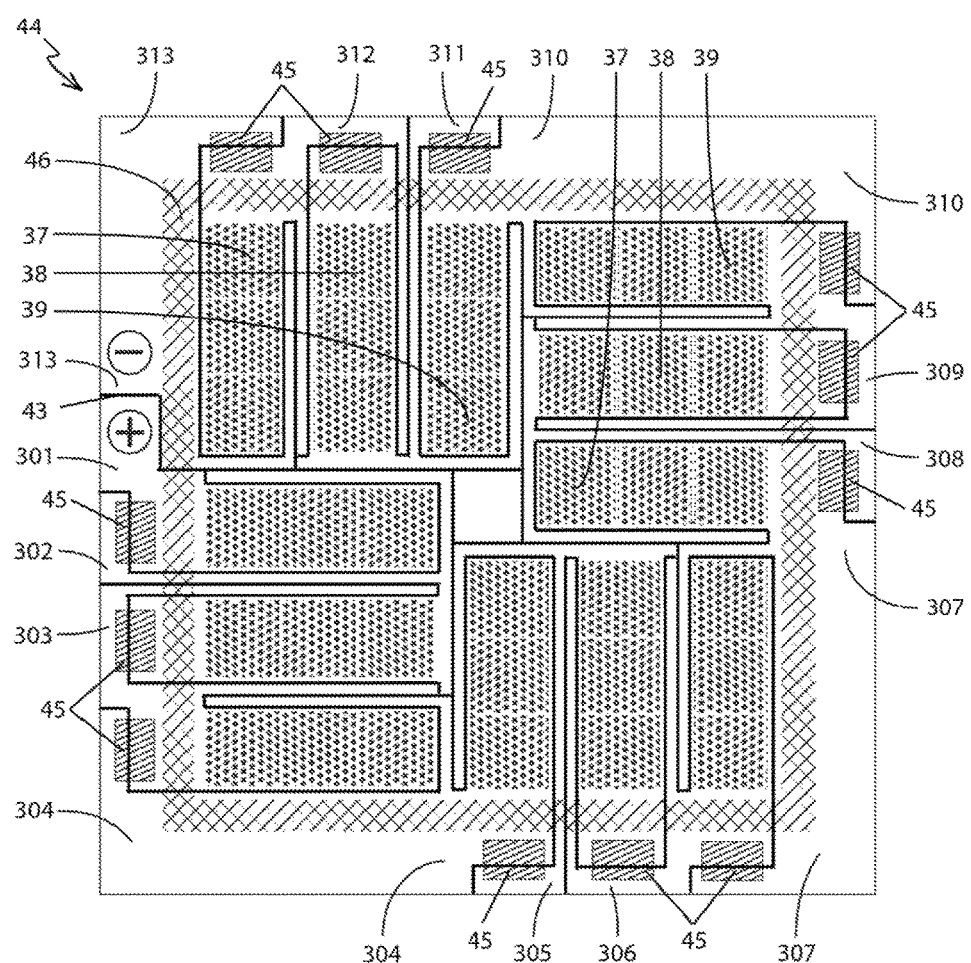
FIG. 32 is a plan view of the details of a circuit board for photovoltaic cells in accordance with the first embodiment.

FIG. 32 shows a highly preferred layout that implements the wiring diagram of FIG. 31 on a single planar circuit card 44, as used in the first embodiment. In this example, each parallel group 36 is comprised of three photovoltaic cells 30, and the fill circuit has twelve such parallel groups 36, three in each quadrant, i.e., an outer group 37, a central group 38, and an inner group 39. It will be clear that other configurations with a different number of cells in each group, and a different number of groups per quadrant, could also be used as desired to optimize for cell and concentrator size. A preferred circuit card 44 comprises copper direct bonded (DBC) onto a thermally conductive ceramic substrate such as aluminum nitride. It should be understood that other thermally conductive ceramics such as alumina or beryllia could also be used.

The circuit card 44 as shown, together with the wirebonds 40 and 41, provides all the parallel and series connections, for parallel cell groups 37, 38, and 39, and also for the bypass diodes 45, which are connected electrically in parallel with each parallel cell group as in FIG. 31. For clarity, the wirebonds 40 and 41 are not shown in FIG. 32, but it should be understood that such wirebonds will be used as illustrated in FIG. 5. The circuit as illustrated in FIG. 31 has thirteen regions of different electrical potential, from the positive output terminal 301 to the negative output terminal 313. As in FIG. 30, most lands are substantially U-shaped, and receive current through wirebonds 40 and 41 from both side of electrodes in given parallel group 37, 38, and 39, and are separated electrically by etched outlines 43 on the cell card's face.

Figure 33:
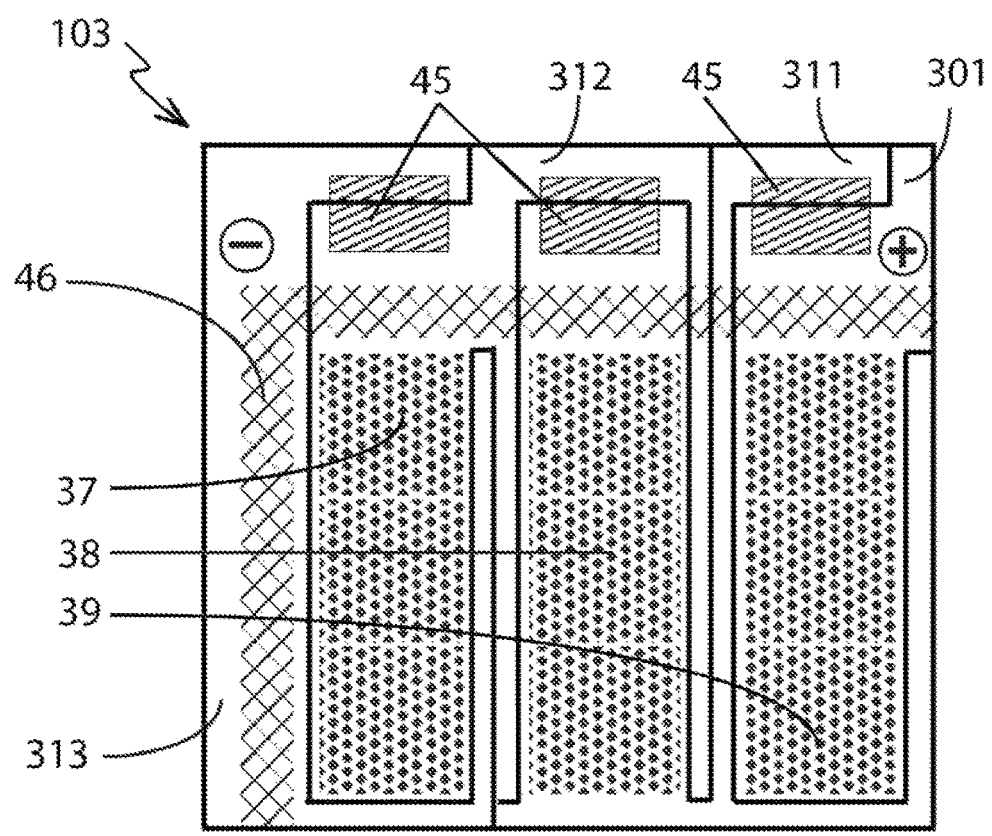
FIG. 33 is a plan view of the details of a circuit board for photovoltaic cells in accordance with the second embodiment.

FIG. 33 shows a highly preferred circuit layout that implements the wiring diagram of FIG. 31 of one of four identical quadrant circuit cards, as used in the second embodiment. The four cards are used together as shown in FIG. 20a. Interconnections between the four cards to complete the circuit of FIG. 31 are made between the positive electrical potential on land 301 which is wired to the negative potential 313 of the adjacent circuit card via connectors on each land.

FIG. 37 is a cross-sectional schematic diagram showing how the wedge support structure 53 may be used to maintain optical and mechanical alignment of the components of the secondary assembly 17, within the PCI 20. Thermal adhesive 47 between the wedge support structure 53, interior wedge reflectors 16, perimeter wedge reflectors 15, and the cell cards 44 provides mechanical support and alignment, as well as heat transfer from the wedge reflectors 16 to the cell cards 44. The heat is removed from the back surface of the cell cards 49 by fluid coupling to a heat transfer system (not shown) which does not provide mechanical support.

Within the PCU 20, alignment of secondary assembly 17 to the PCU's lens 70 is provided by the PCU housing structure 68 with the lens O-ring 48. This structure 68 is in turn held in position and attached to the PCU support arm 25 by the PCU attachment bracket 69.

Figure 35:
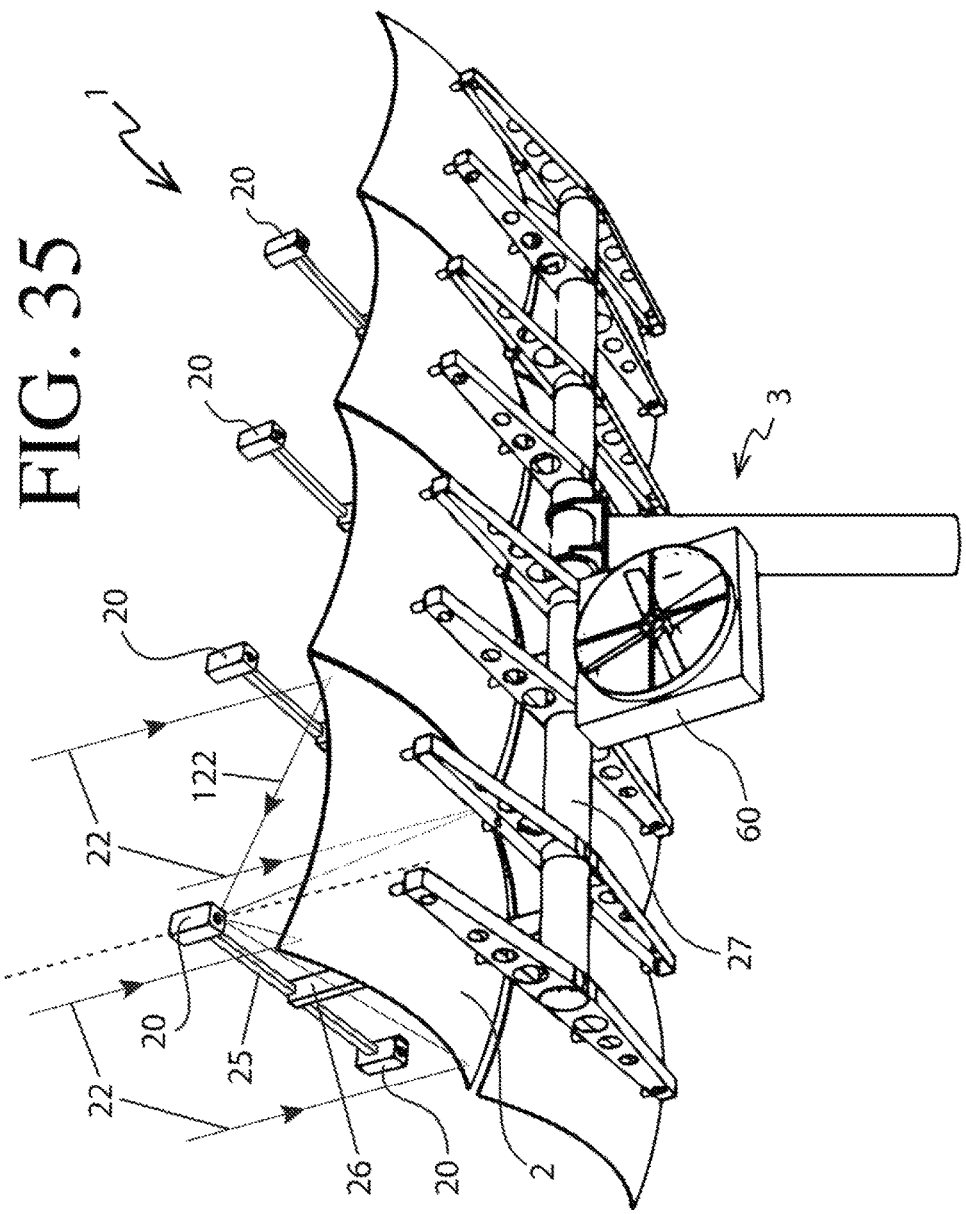
FIG. 35 is a perspective view of a solar concentrating apparatus according to the present invention showing an array of a plurality of dish reflectors and corresponding Power Conversion Units.

In the interest of efficiency and scale, a preferred implementation has multiple PCUs 20 and reflectors 2 on a single two-axis tracking system 3. FIG. 35 details one such implementation where eight PCU's 20, are supported above eight dish reflectors 2 held to face the sun by a single two-axis tracking system 3.

Figure 34:
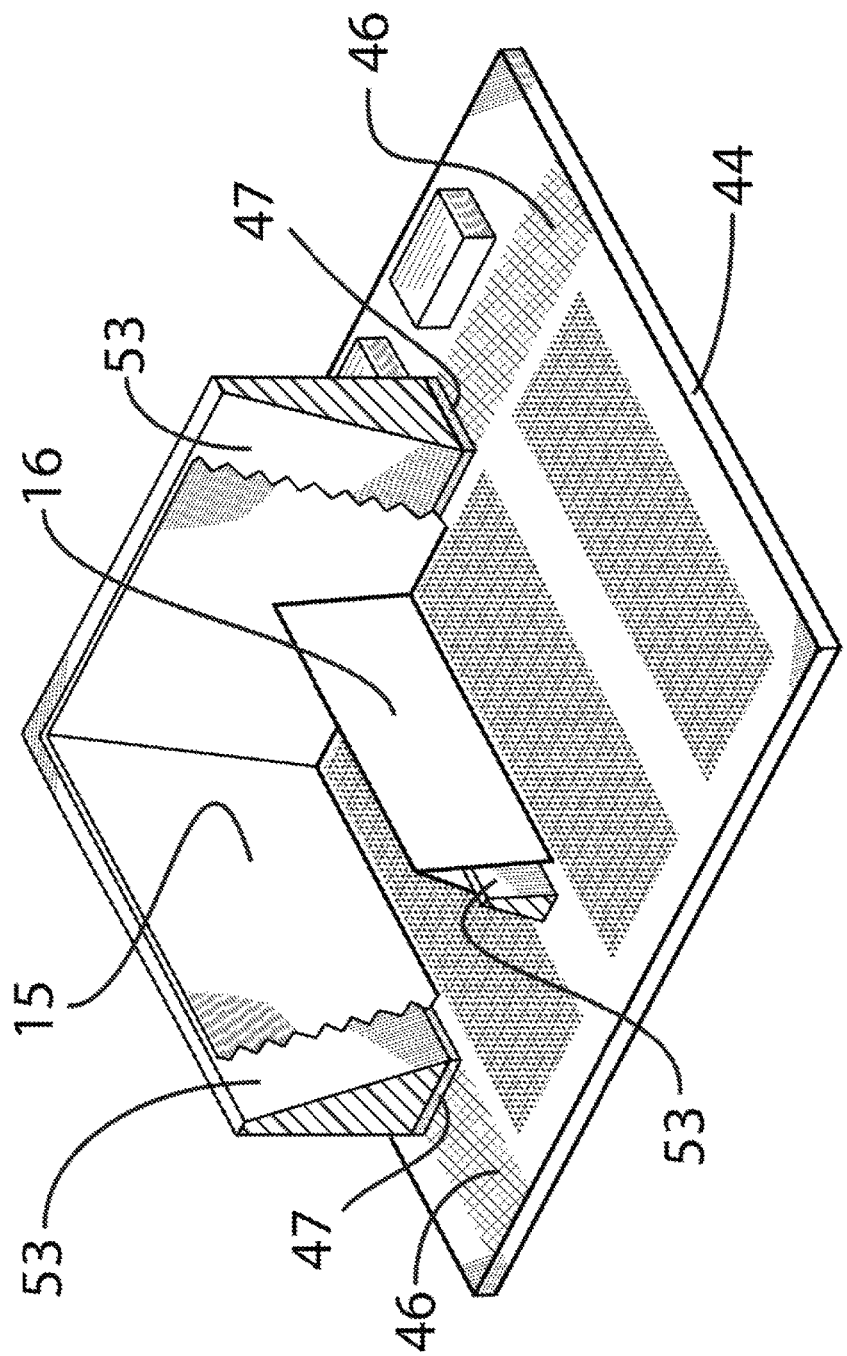
FIG. 34 is a partially cut-away perspective view of a circuit board for photovoltaic cells showing a thermal pathway between wedge support structure and the circuit board.

The wedge reflectors receive heat during operation, because in a practical system their reflectivity is not perfect. A preferred method to dissipate this heat is by thermal conduction to the cell card below. The conduction path for the folded wedge reflector assemblies of FIG. 28e and FIG. 28i is via a wedge support structure 53 using a thermal adhesive 47, as shown in FIG. 5. The heat absorbed by the interior wedge reflectors 16 is preferably thermally conducted outward along the wedge support structure 53 to its perimeter lying under the perimeter wedges 15. As shown in FIG. 28i, gaps are provided through the notches 73 located on faces 57 and 59 for the support structure 53. As shown in FIG. 34, at the notch 73 location where interior wedge reflectors 16 are fitted into a perimeter edge reflector 15, the wedge support structure 53 is then bonded to the cell card 44 along the perimeter using thermal adhesive 47 over the adhesive footprint region 46. In this way, heat is carried by conduction down through the perimeter's thermal adhesive footprint 46 into the ceramic cell circuit card 44. This thermal adhesive footprint 46 surrounding the parallel groups of cells 37, 38, and 39 is also shown in FIG. 32 for the first embodiment and FIG. 33 for the second embodiment. The thickness and compliance of this thermal adhesive layer is preferably chosen so as to take the differential thermal expansion between the wedge support structure 53 and the circuit card 44 without excessive mechanical stress, and the thermal conductivity is chosen to be high enough to transmit the heat without excessive temperature gradient.

Figure 36:
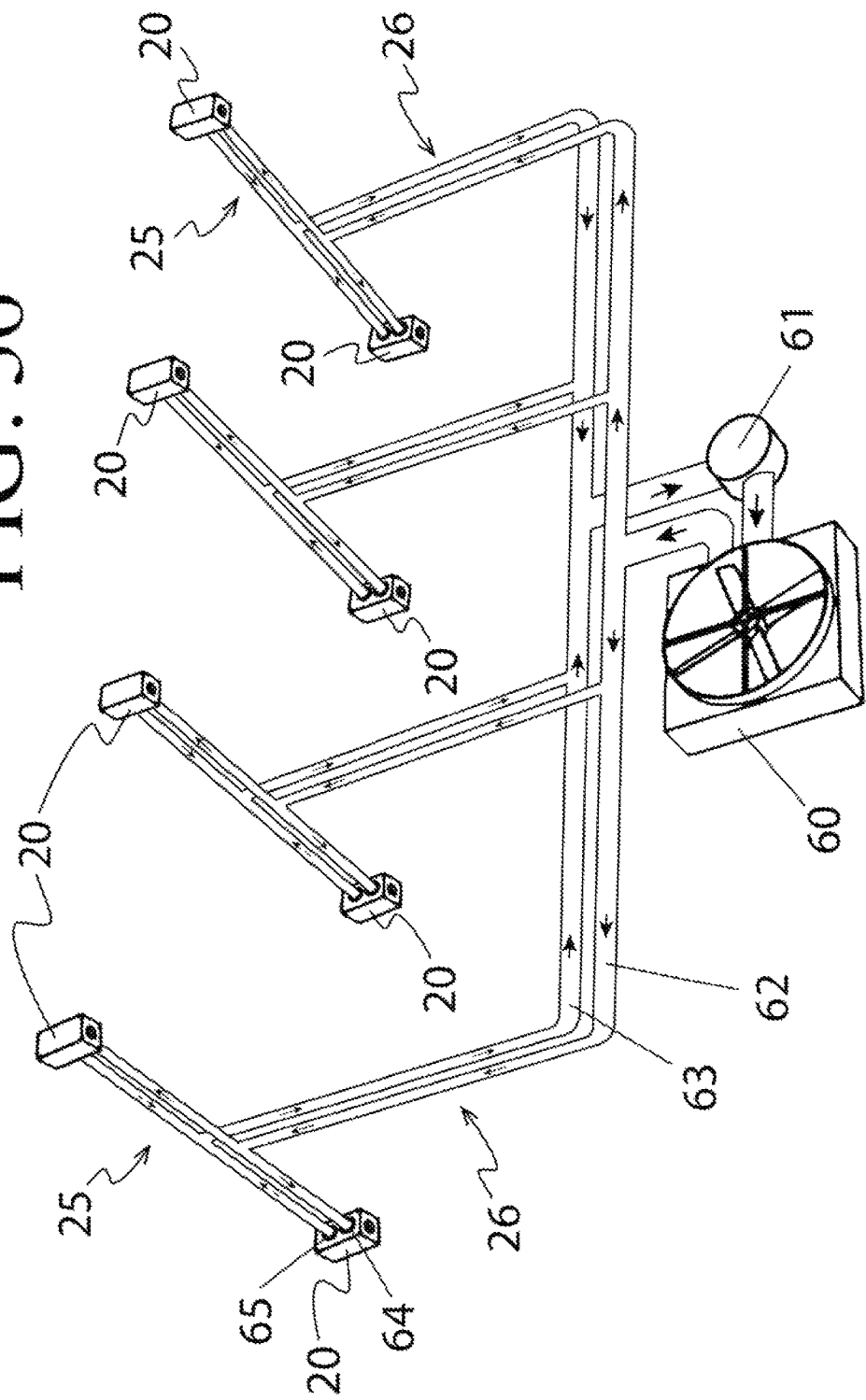
FIG. 36 is a schematic diagram of a solar concentrating apparatus according to the present invention showing coolant flow for the array of Power Conversion Units shown in FIG. 35.

Referring to FIG. 36, in a preferred implementation of the complete cooling system, the heat from each cell is not transferred by thermal conduction to the air locally, as in most prior art, but the heat from multiple cells on a circuit card is transferred by a heat transfer fluid running through microchannels or between pins attached the rear surface 49 of each cell card. The fluid passes through a plumbing manifold to a single fan/radiator unit 60, rigidly attached to the elevation mirror support structure 27 of the concentrated photovoltaic generator 1. This common fan/radiator unit 60 serves the multiple PCUs 20 and acts as a partial counterweight to the multiple dish reflectors 2 and PCUs 20 of a complete generator 1.

FIG. 36 illustrates the plumbing configuration for a cooling system. Upon leaving the common generator pump 61, coolant enters the single fan/radiator unit 60 and passes into the main parallel inlet manifold 62 that runs along the length of the generator's elevation axis. The manifold is then split in parallel at each of the multiplicity of cantilevered pillars 26 that transfer the coolant up to the PCU support arm 25. The manifold is then split further in parallel through each support arm 25 to a PCU 20.

At the end of the PCU support arm 25 the coolant leaves the inlet manifold 62 and enters the PCU 20 via a quick-disconnect inlet 64, passes behind the cell circuit card 44 or cards 101 and out the outlet manifold 63 via a quick-disconnect outlet 65. The quick-disconnect junctions 64 and 65 are used so that the small PCUs 20 can be easily removed and replaced. The coolant then flows through the outlet manifold 63, mirroring the same parallel connection path of the inlet manifold 62 until it passes through the common generator pump 61 and back into the fan/radiator unit 60.

One goal of the present invention is to provide an inexpensive and efficient way to couple clustered, small photovoltaic cells to sunlight focused by a single large and inexpensive dish reflector. The present invention greatly reduces manufacturing cost by using secondary optics that provide for cells in flat arrays on small circuit cards and using secondary reflectors with flat, pre-manufactured, foldable surfaces.

Those skilled in the art, after having the benefit of this disclosure, will appreciate that modifications and changes may be made to the embodiments described herein, different materials may be substituted, equivalent features may be used, changes may be made in the steps of manufacturing processes, and additional elements and steps may be added, all without departing from the scope and spirit of the invention. This disclosure has set forth certain presently preferred embodiments and examples only, and no attempt has been made to describe every variation and embodiment that is encompassed within the scope of the present invention. The scope of the invention is therefore defined by the claims appended hereto, and is not limited to the specific examples set forth in the above description.

TABLE 1

| | |
|---|---|
| Primary reflector | F/0.66 Square Paraboloidal Mirror with 2.56 m² area, f = 1.5 m |
| Optical Window | Flat, n = 1.53 @ λ = 500 nm<br>Dimensions: 16 cm square, at +85 mm from parabolic focus<br>Thickness: 4 mm |
| Lens Element 1 | f = 106 mm, n = 1.46 @ λ = 500 nm<br>Surface 1: $R_1$ = 0 at −40 mm from parabolic focus<br>Thickness: 46 mm<br>Surface 2: $R_2$ = 53.56 mm with Conic = −0.9<br>Material: fused silica |
| Lens Element 2 | f = 183 mm, n = 1.46 @ λ = 500 nm<br>Surface 1: $R_1$ = 160 mm at −87 mm from parabolic focus<br>Thickness: 41 mm<br>Surface 2: $R_2$ = −160 mm2<br>Material: fused silica |

TABLE 1-continued

| | |
|---|---|
| Non-Imaging Optics | Type: Flat silvered wedges<br>Angle: 14°<br>Location: 191 mm from parabolic focus<br>Thickness: 20 mm toward parabolic focus at edges, 10 mm around cells |
| Solar Cells | Type: Triple Junction Solar Cells<br>Array Size: 36 × 10 mm square @ 191 mm from parabolic focus<br>Concentration Factor: 710x |
| System Properties | Silica Mass: 400 g/m²<br>90% Power Point @ 0.7° in the Elevation Pointing direction<br>Geometric concentration 710 X |

TABLE 2

| | |
|---|---|
| Collection Aperture | F/0.66 Square Paraboloidal Mirror with 2.56 m² area, f = 1.5 m |
| Lens Element 1 | f = 48.1 mm, n = 1.46 @ λ = 500 nm, vertex located 60 mm in front of Parabolic Focus<br>Surface 1: $R_1$ = 60 mm<br>Thickness: 95 mm<br>Material: fused silica<br>Surface 2: $R_2$ = −35 mm |
| Non-Imaging Optics | Type: Flat silvered wedges<br>Angle: 14°<br>Location: Center of quadrants located at 83 mm from parabolic focus<br>Thickness: 6 mm toward parabolic focus from quadrants |
| Solar Cells | Type: Triple Junction Solar Cells<br>Array Size: 36 × 8.8 mm square on 4 separate circuit cards<br>Concentration Factor: 918x |
| System Properties | Silica Mass: 450 g/m²<br>90% Power Point @ 0.6° for both azimuth and elevation mispointing<br>Geometric concentration 918 X |

What is claimed is:

1. An apparatus for generating electricity from solar radiation, comprising:
   a dish-shaped reflector having a focus;
   photovoltaic cells configured in a planar array comprising a plurality of photovoltaic cells, said photovoltaic cells having photovoltaically active areas and photovoltaically inactive areas, said photovoltaic cells being operative to generate electricity when the photovoltaically active areas are illuminated with solar radiation;
   secondary optics near said focus comprising a lens together with origami optics comprising a plurality of sharp interior wedge reflectors positioned at gaps between said photovoltaic cells, said secondary optics being configured to apportion solar radiation reflected from said dish-shaped reflector onto the photovoltaically active areas of said photovoltaic cells in substantially equal amounts;
   said secondary optics comprises a single double convex lens being configured such that incoming refracted rays of solar radiation exiting the exit surface of said single double convex lens form a curved image of said dish-shaped reflector, said curved image having an image surface, and the refracted rays are substantially perpendicular locally to the image surface;
   further comprising a plurality of planar arrays of photovoltaic cells, said planar arrays of photovoltaic cells being positioned at angles to each other to approximate the curved image, each planar array of photovoltaic cells having a center and being configured with its center substantially parallel to the image surface and perpendicular to incoming refracted rays; and wherein said dish-shaped reflector is operative to reflect solar radiation to said secondary optics, and said secondary optics being operative in cooperation with said secondary optics to spread solar radiation substantially equally over the photovoltaically active areas of said photovoltaic cells and direct solar radiation away from the photovoltaically inactive areas of said photovoltaic cells so that said photovoltaic cells generate substantially equal electrical current when illuminated with solar radiation.

2. The apparatus for generating electricity from solar radiation according to claim 1, wherein:

said origami optics on each said planar array of photovoltaic cells are made from a sheet of flat material having a reflective surface by creating deep grooves corresponding to fold lines in a geometrical configuration such that when the sheet is folded along the fold lines, a plurality of interior wedge reflectors are formed having sharp edges in positions corresponding to the perimeter of photovoltaically active areas of a plurality of said photovoltaic cells.

3. The apparatus for generating electricity from solar radiation according to claim 1, wherein:

said origami optics further comprises perimeter wedge reflectors positioned around the perimeter of said photovoltaic cells on each said planar array, said perimeter wedge reflectors being configured to reflect solar radiation and illuminate the photovoltaically active areas of said photovoltaic cells with solar radiation which would otherwise not contribute to the electricity generated by said photovoltaic cells, matching said secondary optics to a pattern of illumination of said dish-shaped reflector to ensure equal division of light between said planar arrays of photovoltaic cells despite uneven illumination of said dish-shaped reflector.

4. The apparatus for generating electricity from solar radiation according to claim 3, further comprising:

a plurality of dish-shaped reflectors supported on a two-axis tracking mount, said two-axis tracking mount being adapted to position said plurality of dish-shaped reflectors toward the sun and to track the movement of the sun across the sky so that solar radiation from the sun is reflected from said dish-shaped reflectors toward said secondary optics.

5. The apparatus for generating electricity from solar radiation according to claim 4, further comprising:

a central reflector configured to compensate for shadows due to obstructions to solar radiation by structural elements ahead of said dish-shaped reflector, said central reflector being positioned to reflect solar radiation from a central unshadowed area onto one or more said photovoltaic cells which would otherwise be shadowed by said structural elements.

6. An apparatus for generating electricity from solar radiation, comprising:

a dish-shaped reflector having a focus;

a double convex lens near said focus being configured such that refracted rays of solar radiation exiting said double convex lens form a curved image of said dish-shaped reflector whose position is stable against solar tracking errors, and the refracted rays are substantially perpendicular locally to said curved image surface, depending on tracking error;

photovoltaic cells configured in a plurality of planar arrays, each array having a plurality of photovoltaic cells that are coplanar with the plane of the array, and said planar arrays of photovoltaic cells being tilted at angles to each other to approximate a bowl shape set behind said curved image surface, each planar array of photovoltaic cells having a center and being configured with its center substantially tangent to the image surface and perpendicular to incoming refracted rays;

origami reflecting optics positioned between said image surface and said planar arrays of photovoltaic cells, and configured to redirect and apportion essentially all the solar radiation from said image onto the photovoltaically active areas of said photovoltaic cells in substantially equal amounts;

wherein said dish-shaped reflector is operative to reflect solar radiation to said lens, and said lens being operative in cooperation with said origami reflecting optics to divide solar radiation substantially equally between said photovoltaic cells and direct solar radiation away from the gaps between said planar arrays and photovoltaic cells and from inactive edges of said cells, so that all said photovoltaic cells on the different coplanar arrays generate substantially equal electrical current when the apparatus is oriented to the sun.

7. The apparatus for generating electricity from solar radiation according to claim 6, wherein:

said origami optics on each said planar array of photovoltaic cells are made from a sheet of flat material having a reflective surface by creating deep grooves corresponding to fold lines in a geometrical configuration such that when the sheet is folded along the fold lines, a plurality of interior wedge reflectors are formed having sharp edges in positions corresponding to the perimeter of photovoltaically active areas of a plurality of said photovoltaic cells.

8. The apparatus for generating electricity from solar radiation according to claim 6, wherein:

said origami optics comprise a plurality of sharp interior wedge reflectors positioned above the gaps between said photovoltaic cells of each coplanar array, and further comprises perimeter wedge reflectors positioned around the perimeter of each said planar array, said interior wedge and perimeter wedge reflectors being configured to reflect solar radiation and illuminate the photovoltaically active areas of said photovoltaic cells with that part of the concentrated solar radiation which would otherwise fall either between the cells on a coplanar array or between the arrays and thus not contribute to the electricity generated by said photovoltaic cells, and to ensure equal division of concentrated sunlight between said photovoltaic cells despite the spatial variation of intensity in the curved image of said dish-shaped reflector formed by said double convex lens, and despite the dependence of the angles of rays entering said wedge and perimeter reflectors on tracking errors and on cell position within a given planar array.

9. The apparatus for generating electricity from solar radiation according to claim 8, further comprising:

a plurality of dish-shaped reflectors supported on a two-axis tracking mount, said two-axis tracking mount being adapted to position said plurality of dish-shaped reflectors toward the sun and to track the movement of the sun across the sky so that solar radiation from the sun is reflected from said dish-shaped reflectors toward said secondary optics.

10. The apparatus for generating electricity from solar radiation according to claim 9, further comprising:

a central reflector along with the origami reflectors configured to compensate for shadows due to obstructions to solar radiation by structural elements ahead of said dish-shaped reflector, said central reflector being positioned to reflect solar radiation from a central unshadowed area onto one or more said photovoltaic cells which would otherwise be shadowed by said structural elements.

* * * * *